US008384817B2

(12) United States Patent
Abe

(10) Patent No.: US 8,384,817 B2
(45) Date of Patent: Feb. 26, 2013

(54) SOLID-STATE IMAGER, METHOD OF MANUFACTURING THE SAME, AND CAMERA

(75) Inventor: Hideshi Abe, Kanagawa (JP)

(73) Assignee: Sony Corporation, Tokyo (JP)

( * ) Notice: Subject to any disclaimer, the term of this patent is extended or adjusted under 35 U.S.C. 154(b) by 524 days.

(21) Appl. No.: 12/619,292

(22) Filed: Nov. 16, 2009

(65) Prior Publication Data

US 2010/0123811 A1 May 20, 2010

(30) Foreign Application Priority Data

Nov. 17, 2008 (JP) ................................ 2008-293314
Mar. 13, 2009 (JP) ................................ 2009-060761

(51) Int. Cl.
*H04N 5/225* (2006.01)
*G02B 13/16* (2006.01)
(52) U.S. Cl. ......... 348/335; 348/340; 348/345; 348/348
(58) Field of Classification Search .................. 348/335, 348/340, 345, 348; 250/208.1, 216, 214.1; 257/290–292
See application file for complete search history.

(56) References Cited

U.S. PATENT DOCUMENTS

| 7,522,801 | B2 * | 4/2009 | Makita ........................... 385/129 |
| 2005/0145967 | A1 * | 7/2005 | Kawano et al. ............... 257/436 |

FOREIGN PATENT DOCUMENTS

| JP | 2600250 | 1/1997 |
| JP | 2003-273342 | 9/2003 |
| JP | 2004-221532 | 8/2004 |
| JP | 2006-261247 | 9/2006 |
| JP | 2006261247 A | * 9/2006 |
| JP | 2008-085174 A | 4/2008 |
| JP | 2009-124053 A | 6/2009 |

OTHER PUBLICATIONS

J. Gambino et al.; CMOS Imager with Copper Wiring and Lightpipe; 2006 IEDM Technical Digest; Session 5.5.
Japanese Patent Office, Office Action issued in Patent Application JP 2009-060761, on Nov. 16, 2010.

* cited by examiner

*Primary Examiner* — Yogesh Aggarwal
(74) *Attorney, Agent, or Firm* — SNR Denton US LLP

(57) ABSTRACT

A solid-state imager includes a photoelectric conversion region for photoelectrically converting a light beam received on a light receiving surface thereof into a signal charge and a waveguide path for guiding the light beam to the light receiving surface. The waveguide path includes a plurality of waveguide members, each waveguide member guiding a light beam incident on a light incident surface thereof to a light output surface thereof. The plurality of waveguide members are laminated on the light receiving surface. A first waveguide member closest to the light receiving surface from among the plurality of waveguide members faces the light receiving surface and is smaller in area than a light incident surface of a second waveguide member farthest from the light receiving surface from among the plurality of waveguide members.

14 Claims, 26 Drawing Sheets

FIG. 6A
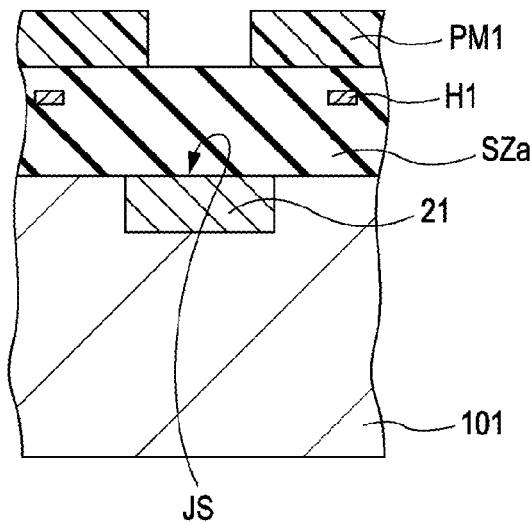
FIG. 6B
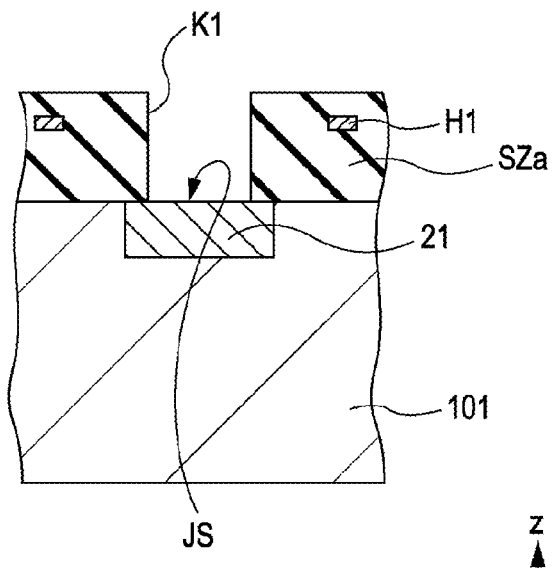
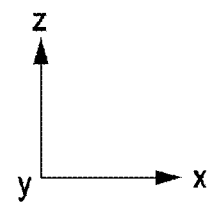

Dab

Dab

Dab

Dab

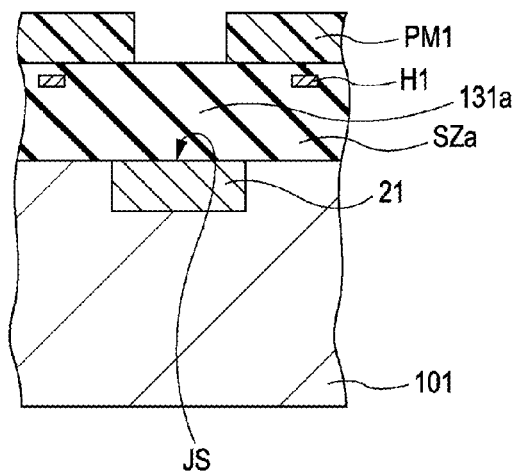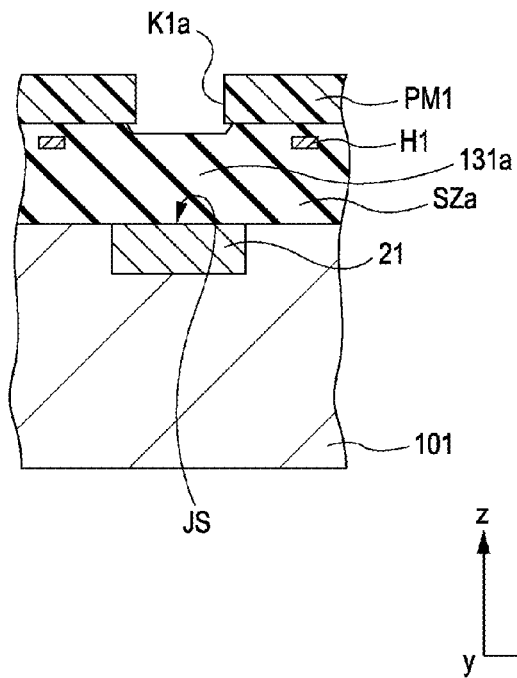

FIG. 25A
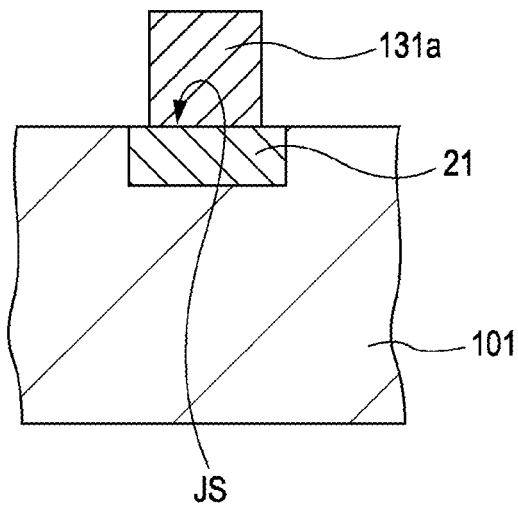
FIG. 25B
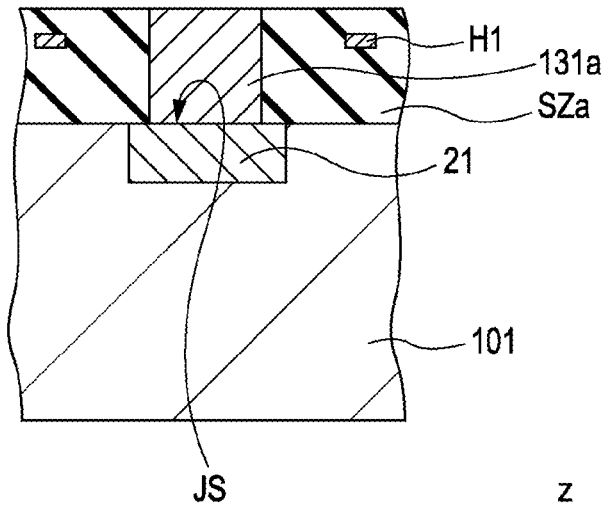
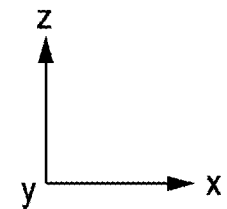

SOLID-STATE IMAGER, METHOD OF MANUFACTURING THE SAME, AND CAMERA

BACKGROUND OF THE INVENTION

1. Field of the Invention

The present invention relates to a solid-state imager, a method of manufacturing the same, and a camera. More specifically, the present invention relates to a solid-state imager including a photoelectric conversion region for photoelectrically converting a light beam received on a light receiving surface thereof into a signal charge, and a waveguide path for guiding the light beam to the light receiving surface. The present invention also relates to a method for manufacturing the solid-state imager and a camera including the solid-state imager.

2. Description of the Related Art

Cameras, such as a digital video camera and a digital still camera, include a solid-state imager. The solid-state imagers includes a complementary metal oxide semiconductor (CMOS) image sensor, and a charge-coupled device (CCD), for example.

In the solid-state imager, an imaging region composed of a plurality of pixels is arranged on the surface of a semiconductor substrate. A plurality of photoelectric conversion regions arranged respectively for a plurality of pixels in the imaging region receive a light beam of a subject image and generates a signal charge by photoelectrically converting the received light beam. For example, a photodiode serves as the photoelectric conversion region.

In the solid-state imager, the photoelectric conversion region such as a photodiode receives on a light receiving surface thereof a light beam collected by a micro lens as disclosed in Japanese Patent No. 2600250 and Japanese Unexamined Patent Application Publication No. 2003-273342.

The use of a "pupil correction" technique adjusts the positional relationship between the micro lens and the light receiving surface of the photoelectric conversion region.

The solid-state imager includes a waveguide path for each pixel in order to increase the collection efficiency of light, and thus gain of the imager.

The waveguide path guides light collected by the micro lens to the light receiving surface of the photoelectric conversion region.

More specifically, the waveguide path has a core section constructed of an optical material having a high refraction index and guiding the light. The waveguide path also includes a clad section having a refraction index lower than that of the core section and surrounds the core section. The waveguide path thus totally reflects light on the border between the core section and the clad section. The waveguide path increases the collection efficiency of light, leading to high gain. Reference is made to Japanese Unexamined Patent Application Publication Nos. 2004-221532, and 2006-261247, and "CMOS Imager with Copper Wiring and Lightpipe," 2006 IEDM Technical Digest Session 5.5, J. Gambino et. al.

For example, the waveguide path is produced by laminating a member functioning as a clad on a substrate bearing a photoelectric conversion region, arranging an aperture in the laminate body so that a light receiving surface of the photoelectric conversion region is exposed and filling the aperture with an optical material having a high refraction index.

SUMMARY OF THE INVENTION

The number of pixels in the imaging area of the solid-state imager is increasing in order to generate a high-resolution image. Compact design is also implemented in the solid-state imager. For this reason, the area of the light receiving surface of the photoelectric conversion region becomes smaller in the imaging area of the solid-state imager. An aperture for the waveguide path has a higher aspect ratio, and insertion of an optical member having a high refraction index into the aperture becomes difficult. Difficulty in constructing an appropriate waveguide path leads to low reliability and low production yield of the imagers. The production of a high-gain imager is difficult. Image quality of captured images is lowered.

A CMOS type image sensor implementing system-on-chip design includes many peripheral circuits with a plurality of wiring layers incorporated. The aspect ratio of the aperture for the waveguide path becomes substantially higher, thereby leading to the problems described above.

It is thus desirable to provide a solid-state imager that provides high reliability and high production yield, and captures images of high image quality. It is also desirable to provide a method of manufacturing the solid-state imager and a camera including the solid-state imager.

According to one embodiment of the present invention, a solid-state imager includes a photoelectric conversion region for photoelectrically converting a light beam received on a light receiving surface thereof into a signal charge, and a waveguide path for guiding the light beam to the light receiving surface. The waveguide path includes a plurality of waveguide members, each waveguide member guiding a light beam incident on a light incident surface thereof to a light output surface thereof. The plurality of waveguide members are laminated on the light receiving surface. A light output surface of a first waveguide member closest to the light receiving surface from among the plurality of waveguide members faces the light receiving surface, and is smaller in area than a light incident surface of a second waveguide member farthest from the light receiving surface from among the plurality of waveguide members.

Each of the plurality of waveguide members of the waveguide path may extend in a direction perpendicular to the light receiving surface.

The waveguide path may include a step on a side surface thereof extending in the direction perpendicular to the light receiving surface. The plurality of waveguide members have the side surfaces thereof different in position in a plane in parallel with the light receiving surface. The plurality of waveguide members are laminated so that light emitted at the step of the waveguide path re-enters the waveguide path as evanescent light.

The plurality of waveguide members of the waveguide path may be laminated so that the width dimension of the step is shorter than the wavelength of the light, incident on the waveguide path, in the plane in parallel with the light receiving surface.

The first waveguide member of the waveguide path may have the light output surface smaller in area than the light receiving surface of the photoelectric conversion region.

The step of the waveguide path may be tapered with respect to the direction perpendicular to the light receiving surface.

A plurality of photoelectric conversion regions may be arranged on a surface of a substrate, and a plurality of waveguide paths may be arranged on the surface of the substrate respectively for the plurality of photoelectric conversion regions.

The plurality of photoelectric conversion regions are arranged with the light receiving surfaces thereof spaced from each other with a first pitch on the surface of the substrate. The plurality of waveguide paths are arranged with the light incident surfaces of the second waveguide members thereof spaced from each other with a second pitch on the surface of the substrate, the second pitch being smaller than the first pitch. The light output surface of the first waveguide member is shifted with respect to the light incident surface of the second waveguide member in a plane in parallel with the light receiving surface so that the light output surface of the first waveguide member faces the light receiving surface.

The solid-state imager may include a plurality of wirings lined in a direction perpendicular to the light receiving surface and spaced from the side surface of the waveguide path. The plurality of wirings include a first wiring arranged to the side surface of the first waveguide member and a second wiring arranged to the side surface of the second waveguide member, and the first wiring and the second wiring are arranged in different positions in a plane in parallel with the light receiving surface.

The solid-state imager may include a plurality of micro lenses for directing incident light toward the waveguide path, and the plurality of micro lenses may be arranged respectively for the plurality of the waveguide paths on the surface of the substrate.

The solid-state imager may further include a plurality of micro lenses for directing incident light toward the waveguide path. The plurality of micro lenses are arranged respectively for the plurality of the waveguide paths on the surface of the substrate, and the optical axis of each micro lens is shifted from the center of the respective light receiving surface. The first waveguide member and the second waveguide member are shifted on a plane in parallel with the light receiving surface so that the light incident surface of the first waveguide member is aligned with the light output surface of the micro lens and so that the light output surface of the second waveguide member is aligned with the light receiving surface.

According to one embodiment of the present invention, a camera includes a photoelectric conversion region for photoelectrically converting a light beam received on a light receiving surface thereof into a signal charge and a waveguide path for guiding the light beam to the light receiving surface. The waveguide path includes a plurality of waveguide members, each waveguide member guiding a light beam incident on a light incident surface thereof to a light output surface thereof. The plurality of waveguide members are laminated on the light receiving surface. A light output surface of a first waveguide member closest to the light receiving surface from among the plurality of waveguide members faces the light receiving surface, and is smaller in area than a light incident surface of a second waveguide member farthest from the light receiving surface from among the plurality of waveguide members.

According to one embodiment of the present invention, a method of manufacturing a solid-state imager includes the steps of forming a photoelectric conversion region for photoelectrically converting a light beam received on a light receiving surface thereof into a signal charge, and forming a waveguide path for guiding the light beam to the light receiving surface. The step of forming the waveguide path includes laminating a plurality of waveguide members on the light receiving surface, each waveguide member guiding a light beam on a light incident surface thereof to a light output surface thereof. A light output surface of a first waveguide member closest to the light receiving surface from among the plurality of waveguide members faces the light receiving surface and is smaller in area than a light incident surface of a second waveguide member farthest from the light receiving surface from among the plurality of waveguide members.

According to embodiments of the present invention, the plurality of waveguide members are laminated on the light receiving surface, each waveguide member guiding the light beam incident on the light incident surface thereof to the light output surface thereof. The waveguide path is thus produced. The light output surface of the first waveguide member closest to the light receiving surface from among the plurality of waveguide members faces the light receiving surface. The light output surface of the first waveguide member is smaller in area than the light incident surface of the second waveguide member farthest from the light receiving surface from among the plurality of waveguide members.

According to embodiments of the present invention, the solid-state imager with high reliability and high production yield is provided. The camera including the solid-state imager and the manufacturing method of the solid-state imager are also provided.

BRIEF DESCRIPTION OF THE DRAWINGS

FIGS. 6A and 6B are sectional views illustrating a major portion of the solid-state imager in process steps in accordance with the first embodiment of the present invention;

FIGS. 16A and 16B illustrate a major portion of the solid-state imager in process steps in accordance with the second embodiment of the present invention;

FIGS. 25A and 25B illustrate a process step of the waveguide path in accordance with one embodiment of the present invention;

DESCRIPTION OF THE PREFERRED EMBODIMENTS

The embodiments of the present invention are described below.

The present invention is described in the following order:
1. First Embodiment (waveguide path produced by laminating a plurality of waveguide members)
2. Second Embodiment (a plurality of waveguide members joining each other at a tapered surface)
3. Third Embodiment ("pupil correction" applied to a plurality of waveguide members and wiring)
4. Fourth Embodiment
5. Alternate Embodiments

First Embodiment

Apparatus Structure

Figure 1:
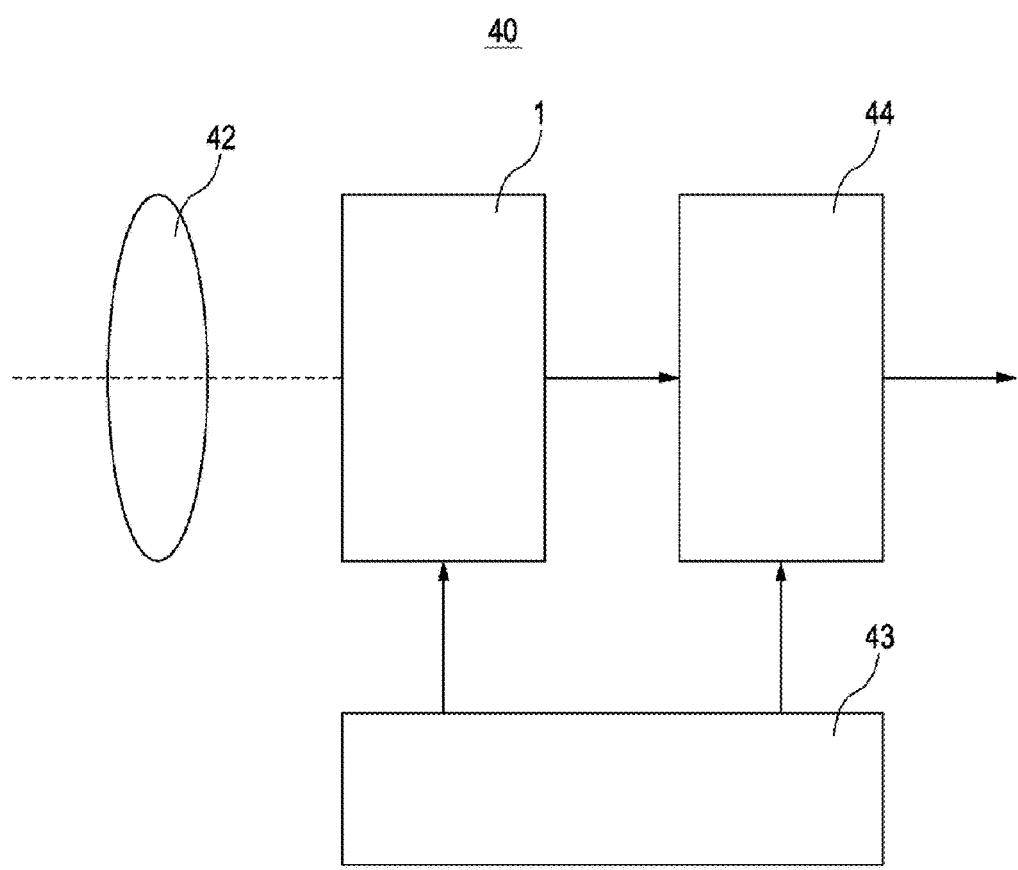
FIG. 1 is a block diagram of a camera in accordance with one embodiment of the present invention.

FIG. 1 illustrates the structure of a camera 40 in accordance with a first embodiment of the present invention.

The camera 40 includes solid-state imager 1, optical system 42, driver circuit 43, and signal processing circuit 44. These elements are described below.

The solid-state imager 1 receives an image of a subject through the optical system 42 and photoelectrically converts light of the image of the subject into a signal charge. The solid-state imager 1 operates in response to a drive signal output from the driver circuit 43. More specifically, the solid-state imager 1 reads the signal charge and outputs the read signal charge as raw data. The solid-state imager 1 is described in detail later.

The optical system 42 including an optical lens focuses the subject image on an imaging surface of the solid-state imager 1. The optical system 42 emits a main light beam onto the center of the imaging surface of the solid-state imager 1 at a right angle with respect to the imaging surface. On the other hand, the optical system 42 emits the main light beam onto a peripheral portion of the imaging surface at a slant angle with respect to the imaging surface. The main light beam from the optical system 42 is thus incident on the imaging surface of the solid-state imager 1 at a more slant angle with respect to the imaging surface as a point of incidence is farther away from the center of the imaging surface.

The driver circuit 43 outputs a variety of drive signals to each of the solid-state imager 1 and the signal processing circuit 44, thereby driving the solid-state imager 1 and the signal processing circuit 44.

The signal processing circuit 44 performs a signal process on the raw data output from the solid-state imager 1, thereby producing a digital image of the subject image.

The solid-state imager 1 is generally discussed.

Figure 2:
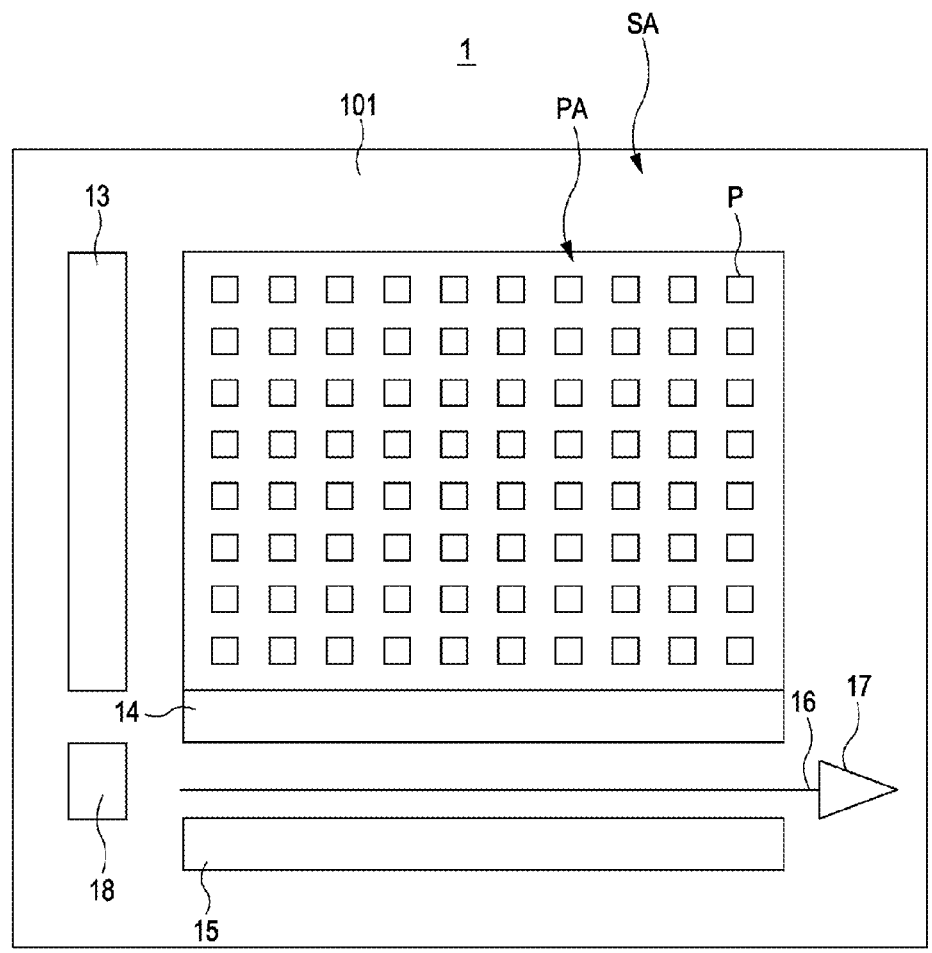
FIG. 2 is a plan view generally illustrating a solid-state imager in accordance with a first embodiment of the present invention.

FIG. 2 is a plan view generally illustrating the structure of the solid-state imager 1 in accordance with the first embodiment of the present invention.

The solid-state imager 1 of the first embodiment is a CMOS type image sensor and includes a substrate 101 as illustrated in FIG. 2. The substrate 101 is a semiconductor substrate manufactured of silicon, and includes an imaging region PA and a peripheral region SA.

The imaging region PA of the substrate 101 has a rectangular shape as illustrated in FIG. 2 and a plurality of pixels P are arranged in an x direction and a y direction. The pixels P are thus arranged in a matrix configuration. The center of the imaging region PA is in alignment with the optical axis of the optical system 42 illustrated in FIG. 1.

As illustrated in FIG. 2, the peripheral region SA of the substrate 101 surrounds the imaging region PA. Peripheral circuits processing a signal charge generated by the pixels P are arranged on the peripheral region SA.

More specifically, the peripheral circuits includes vertical selection circuit 13, column circuit 14, horizontal selection circuit 15, horizontal signal line 16, output circuit 17, and timing generator (TG) 18 as illustrated in FIG. 2.

The vertical selection circuit 13 includes a shift register, and selects and drives the pixels P by row.

The column circuit 14 includes a sample/hold (S/H) circuit and a correlated double sampling (CDS) circuit. The column circuit 14 performs a signal process on the signal read from the pixels P on a per column basis.

The horizontal selection circuit 15 includes a shift register, for example, and successively selects and outputs the signal read from each pixel P by the column circuit 14. The signal successively read from the pixels P by the horizontal selection circuit 15 is output to the output circuit 17 via the horizontal signal line 16.

The output circuit 17 includes a digital amplifier, for example, and performs a signal process such as an amplification operation on the signal output from the horizontal selection circuit 15 and outputs the processed signal to the outside.

The timing generator 18 generates a variety of timing signals, and outputs the generated timing signals to the vertical selection circuit 13, the column circuit 14 and the horizontal selection circuit 15 for driving and control operation.

Figure 3:
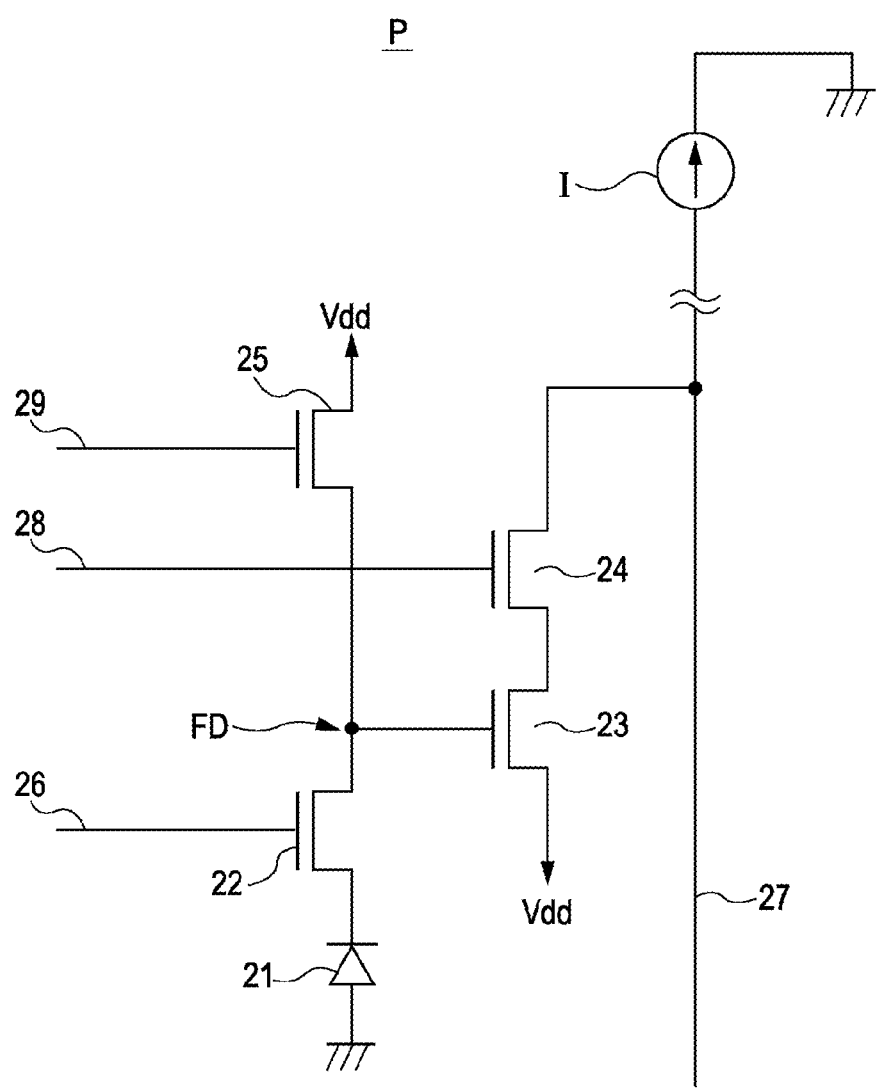
FIG. 3 is a circuit diagram of a major portion of a pixel arranged in an imaging region in accordance with the first embodiment of the present invention.

FIG. 3 is a circuit diagram illustrating a major portion of the pixel P arranged within the imaging region PA in accordance with the first embodiment of the present invention.

The pixel P arranged within the imaging region PA includes photodiode 21, transfer transistor 22, amplifier transistor 23, address transistor 24, and reset transistor 25 as illustrated in FIG. 3. In other words, the pixel P includes the photodiode 21 and the pixel transistors operating to read the signal charge from the photodiode 21.

In the pixel P, the photodiode 21 receives a light beam from the subject image, and photoelectrically converts light of the received light beam to generate and store the signal charge. As illustrated in FIG. 3, the photodiode 21 is connected to the gate of the amplifier transistor 23 via the transfer transistor 22. The signal charge stored by the photodiode 21 is transferred to a floating diffusion region (FD) connected to the gate of the amplifier transistor 23 via the transfer transistor 22 as an output signal.

In the pixel P, the transfer transistor 22 is interposed between the photodiode 21 and the floating diffusion region FD as illustrated in FIG. 3. In response to a transfer pulse received at the gate of the transfer transistor 22 via a transfer line 26, the transfer transistor 22 transfers the signal charge stored on the photodiode 21 to the floating diffusion region FD as the output signal.

In the pixel P, the gate of the amplifier transistor 23 is connected to the floating diffusion region FD as illustrated in FIG. 3. The amplifier transistor 23 amplifies the output signal output via the floating diffusion region FD. The amplifier transistor 23 is connected to a vertical signal line 27 via the address transistor 24, and forms a source follower together with a constant current source I arranged outside the imaging region PA. With an address signal supplied to the address transistor 24, the amplifier transistor 23 amplifies the output signal output via the floating diffusion region FD.

In the pixel P, the gate of the address transistor 24 is connected to an address line 28, which is supplied with an address signal as illustrated in FIG. 3. The address transistor 24 is turned on in response to the supply of the address signal, and thus outputs to the vertical signal line 27 the output signal amplified by the amplifier transistor 23. The output signal is output to the S/H and CDS circuits in the column circuit 14 via the vertical signal line 27.

In the pixel P, the gate of the reset transistor 25 is connected to a reset line 29, which is supplied with a reset signal as illustrated in FIG. 3. The reset transistor 25 is connected between a power source Vdd and the floating diffusion region FD. In response to the reset signal supplied to the gate of the reset transistor 25 via the reset line 29, the reset transistor 25 resets the voltage of the floating diffusion region FD to the voltage of the power source Vdd.

Each of the gates of the transfer transistor 22, the address transistor 24 and the reset transistor 25 is connected on a per row basis, with each row composed of a plurality of pixels arranged in a horizontal direction H. The pixel driving operation is thus concurrently performed on the plurality of pixels on a per row basis. More specifically, the address signal supplied from the above-described vertical selection circuit 13 selects the pixels in a vertical direction on a per horizontal line basis (on a per pixel row basis). A variety of timing signals output from the timing generator 18 control the transistors in each pixel. In this way, the output signal in each pixel is read into the S/H and CDS circuits in the column circuit 14 via the vertical signal line 27.

The solid-state imager 1 of the first embodiment is described in detail below.

Figure 4:
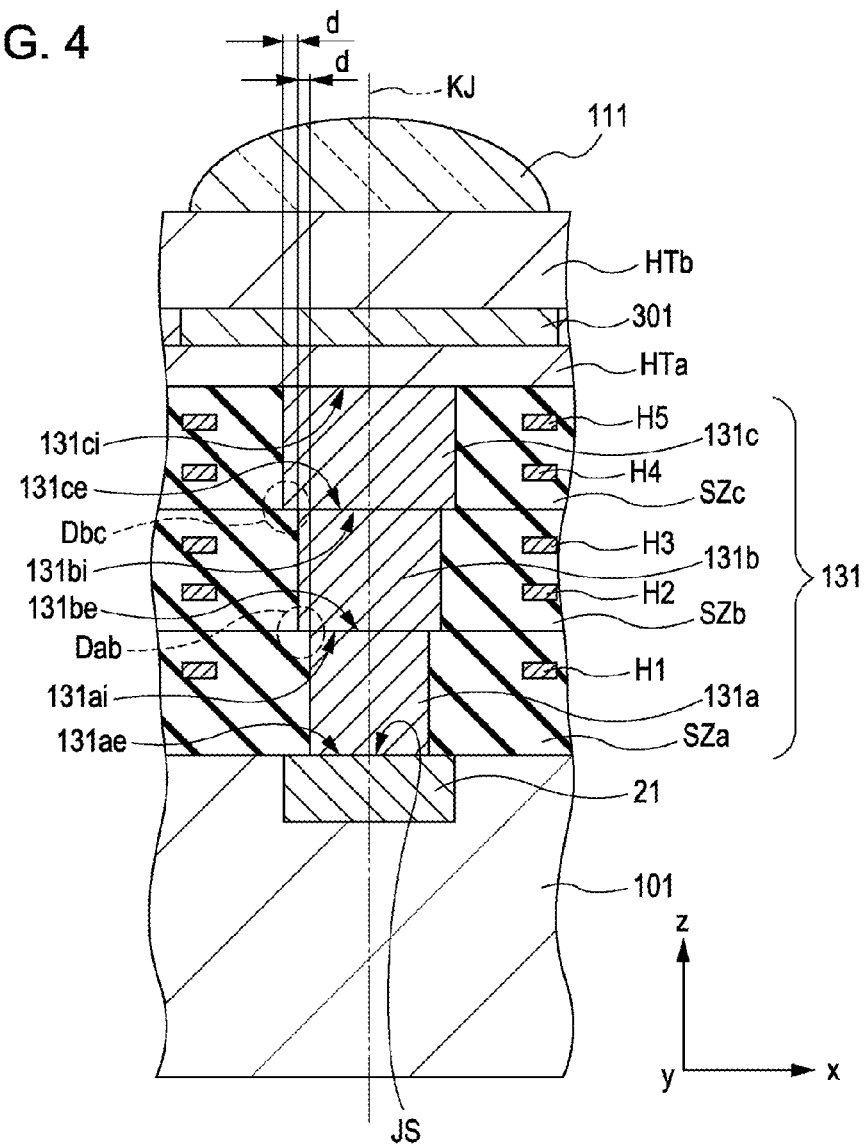
FIG. 4 is a sectional view of a major portion of the solid-state imager in accordance with the first embodiment of the present invention.

FIG. 4 is a sectional view of the pixel P as a major portion of the solid-state imager 1 of the first embodiment of the present invention. The pixel P is arranged on in the imaging region PA on the substrate 101. Although the pixel P includes the photodiode 21 and the other elements, FIG. 4 illustrates only the photodiode 21 of the pixel P and elements closely related to the photodiode 21.

As illustrated in FIG. 4, the solid-state imager 1 includes photodiode 21, micro lens 111, waveguide path 131, and color filter 301 for the pixel P. The waveguide path 131 includes first waveguide member 131a, second waveguide member 131b, and third waveguide member 131c.

Each element of the solid-state imager 1 is described below.

The photodiode 21 is arranged on the surface of the substrate 101 as illustrated in FIG. 4. The photodiode 21 receives a light beam on a light receiving surface JS thereof, and photoelectrically converts the received light beam into a signal charge. A plurality of photodiodes 21 are arranged on the surface of the substrate 101 respectively for a plurality of pixels P. The micro lens 111, the waveguide path 131, and the color filter 301 are arranged in a direction perpendicular to the light receiving surface JS. In this case, the waveguide path 131, the color filter 301, and the micro lens 111 are arranged in that order from the side of the light receiving surface JS. In accordance with the first embodiment, the photodiode 21 receives on the light receiving surface JS the light beam through these elements and photoelectrically converts the received light beam into the signal charge.

The micro lens 111 is a so-called on-chip lens, and is arranged in the surface of the substrate 101 as illustrated in FIG. 4. The micro lens 111 collects the incident light and then guides the light toward the waveguide path 131. The photodiode 21 is arranged in the surface of the substrate 101. The micro lens 111 is arranged so that an optical axis KJ thereof is perpendicular to the light receiving surface JS of the photodiode 21 and aligned with the center of the light receiving surface JS. The micro lens 111 faces the light receiving surface JS of the photodiode 21 through the color filter 301 and the waveguide path 131 in the direction of the optical axis KJ. The micro lens 111 is mounted on a layer HTb resulting from planarizing a surface bearing the color filter 301 as the surface of the substrate 101. The micro lens 111 becomes thicker on the center thereof than on the periphery thereof in the direction of the light receiving surface JS of the photodiode 21. The light collected by the micro lens 111 is thus received at the light receiving surface JS of the photodiode 21 via the color filter 301 and the waveguide path 131.

The waveguide path 131 arranged on the surface of the substrate 101 as illustrated in FIG. 4 so that the incident light is guided to the light receiving surface JS of the photodiode 21. The waveguide path 131 is interposed between the micro lens 111 and the light receiving surface JS of the photodiode 21 so that the light input through the micro lens 111 is guided to the light receiving surface JS of the photodiode 21.

More specifically, a plurality of interlayer insulators, namely, SZa, SZb, and SZc are successively laminated on the substrate 101.

The interlayer insulators SZa, SZb, and SZc are manufactured of a light transmissive material, such as silicon oxide (having a refraction index of n of about 1.43). Optionally, the interlayer insulators SZa, SZb, and SZc may be manufactured of phosphorus doped or boron doped silicon oxide.

Referring to FIG. 4, the waveguide path 131 penetrates the interlayer insulators SZa, SZb, and SZc and extends to the light receiving surface JS of the photodiode 21.

The waveguide path 131 here is stepwise tapered from the micro lens 111 to the photodiode 21 with the cross section thereof in parallel with the light receiving surface JS of the photodiode 21 becoming stepwise smaller as illustrated in FIG. 4.

In accordance with the first embodiment of the present invention, the waveguide path 131 includes first through third waveguide members 131a, 131b, and 131c, each receiving light on the light incident surface thereof and guiding the received light to the light output surface thereof.

The first waveguide member 131a, the second waveguide member 131b, and the third waveguide member 131c are successively laminated on the light receiving surface JS of the photodiode 21 in a manner such that the optical axis KJ of the micro lens 111 extends along the center axis of these waveguides.

Each of the first through third waveguide members 131a, 131b, and 131c of the waveguide path 131 extends in the z direction perpendicular to the light receiving surface JS. More specifically, the side wall of each of the first through third waveguide members 131a, 131b, and 131c is perpendicular to the light receiving surface JS, and the light incident surfaces 131ai, 131bi, and 131ci are identical in shape to the light output surfaces 131ae, 131be, and 131ce, respectively.

In the waveguide path 131, the side walls of the first through third waveguide members 131a, 131b, and 131c are arranged in different positions in an xy plane so that steps Dab and Dbc are formed in the z direction perpendicular to the light receiving surface JS. The first through third waveguide members 131a, 131b, and 131c are laminated so that light emitted at the steps Dab and Dbc of the waveguide path 131 re-enters the waveguide path 131 as evanescent light.

As will be described later in detail, the first through third waveguide members 131a, 131b, and 131c are laminated so that the width dimension d of each of the steps Dab and Dbc in the xy plane in parallel with the light receiving surface JS is shorter than the wavelength of the incident light. More specifically, the first through third waveguide members 131a, 131b, and 131c are produced so that the width dimension d of the steps Dab and Dbc is shorter than the center wavelength of the incident light colored by the color filter 301.

The first through third waveguide members 131a, 131b, and 131c are manufactured of optical materials having a refraction index higher than those of the interlayer insulators SZa, SZb, and SZc surrounding the first through third waveguide members 131a, 131b, and 131c respectively. For example, each of the first through third waveguide members 131a, 131b, and 131c is manufactured of silicon nitride (having a refraction index of about 2) deposited using plasma-enhanced chemical vapor deposition (CVD) technique. Also, each of the first through third waveguide members 131a, 131b, and 131c may be manufactured of polyimide, diamond like carbon (DLC), polysiloxane, etc.

More specifically, the first waveguide member 131a from among the first through third waveguide members 131a, 131b, and 131c in the waveguide path 131 is arranged closest to the light receiving surface JS as illustrated in FIG. 4.

The first waveguide member 131a has the light output surface 131ae facing the light receiving surface JS of the photodiode 21. The first waveguide member 131a has also the light incident surface 131ai facing the light output surface 131be of the second waveguide member 131b.

The second waveguide member 131b of the waveguide path 131 is arranged between the first waveguide member 131a and the third waveguide member 131c as illustrated in FIG. 4.

The second waveguide member 131b has the light output surface 131be facing the light incident surface 131ai of the first waveguide member 131a. The second waveguide member 131b has also the light incident surface 131bi facing the light output surface 131ce of the third waveguide member 131c.

The third waveguide member 131c from among the first through third waveguide members 131a, 131b, and 131c in the third waveguide member 131c is arranged farthest from the light receiving surface JS as illustrated in FIG. 4.

The third waveguide member 131c has the light output surface 131ce facing the light incident surface 131bi of the second waveguide member 131b. The third waveguide member 131c has also the light incident surface 131ci facing a light output surface of the color filter 301.

Figure 5:
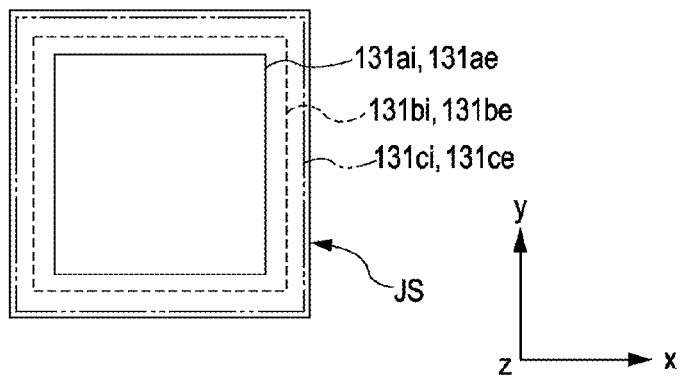
FIG. 5 is a plan view illustrating the relationship between a photodiode and each waveguide member in accordance with the first embodiment of the present invention.

FIG. 5 is a plan view illustrating the relationship of the photodiode 21 and the first through third waveguide members 131a, 131b, and 131c in accordance with the first embodiment of the present invention.

Referring to FIG. 5, the first waveguide member 131a has the light output surface 131ae in contact with the light receiving surface JS of the photodiode 21. Each of the light incident surface 131ai and the light output surface 131ae of the first waveguide member 131a is smaller in area than the light receiving surface JS of the photodiode 21.

Referring to FIG. 5, the light output surface 131be of the second waveguide member 131b is arranged in contact with the light incident surface 131ai of the first waveguide member 131a. Each of the light incident surface 131bi and the light output surface 131be of the second waveguide member 131b is larger in area than each of the light incident surface 131ai and the light output surface 131ae of the first waveguide member 131a.

Referring to FIG. 5, the light output surface 131ce of the third waveguide member 131c is arranged in contact with the light incident surface 131bi of the second waveguide member 131b. Each of the light incident surface 131ci and the light output surface 131ce of the third waveguide member 131c is larger in area than each of the light incident surface 131bi and the light output surface 131be of the second waveguide member 131b.

Wirings H1, H2, H3, H4, and H5 surround the waveguide path 131. The wirings H1, H2, H3, H4, and H5, manufactured of an electrically conductive material, are embedded in the interlayer insulators SZa, SZb, and SZc. For example, the wirings H1, H2, H3, H4, and H5 are manufactured of a metal such as aluminum or copper, and connected to peripheral circuits.

In accordance with the first embodiment, the wirings H1, H2, H3, H4, and H5 are spaced apart from the side wall of the waveguide path 131 in the xy plane in parallel with the light receiving surface JS. The plurality of the wirings H1, H2, H3, H4, and H5 are lined in the z direction perpendicular to the light receiving surface JS.

The color filter 301 is arranged on a planarization layer HTa over the substrate 101 as illustrated in FIG. 4.

When the light of the subject image is received, the color filter 301 colors the light and emits the colored light toward the planarization layer HTa over the substrate 101. Referring to FIG. 4, the color filter 301 faces the light receiving surface JS of the photodiode 21 through the waveguide path 131 in the direction of the optical axis KJ of the micro lens 111. The color filter 301 is produced as a coating layer by applying a coating liquid composed of a color pigment and a photoresist resin onto the substrate through the spin coating technique, and then patterning the coating layer using the lithographic technique.

The color filter 301 of the first embodiment includes in each pixel P a green filter layer, a red filter layer and a blue filter layer. The green filter layer, the red filter layer and the blue filter layer may be arranged in a Bayer pattern.

Manufacturing Method

A method of manufacturing the solid-state imager 1 is described below.

FIGS. 6A and 6B through FIG. 10 are sectional views of major portions of the solid-state imager 1 at process steps in accordance with the first embodiment of the present invention.

Referring to FIG. 6A, the first interlayer insulator SZa and a photoresist mask PM1 are formed.

The first interlayer insulator SZa is formed subsequent to the formation of the photodiode 21.

The photodiode 21 is produced by ion implanting n-type impurities into the substrate 101 as a p-type silicon substrate, for example.

The first interlayer insulator SZa is formed to cover the photodiode 21 in the substrate 101. The first interlayer insulator SZa is formed of a silicon oxide layer, for example.

A lower insulation layer (not shown) is formed on the surface of the substrate 101. An upper insulation (not shown) on top of the lower insulation layer. Through a so-called damocene process, the first wiring H1 is formed in the upper insulation layer. The first wiring H1 is manufactured of aluminum or copper, for example. The first interlayer insulator SZa is thus formed to house the first wiring H1.

The photoresist mask PM1 is formed using the lithographic technique.

More specifically, a photoresist layer (not shown) is formed on the first interlayer insulator SZa using the spin coating technique. A mask pattern is transferred to the photoresist layer through an exposure process using a photomask. By performing a development process on the photoresist layer, the photoresist mask PM1 is produced.

In accordance with the first embodiment of the present invention, the photoresist mask PM1 is formed so that the surface of a region where the first waveguide member 131a is to be formed is exposed in the first interlayer insulator SZa with the remaining area covered.

As illustrated in FIG. 6B, an aperture K1 is formed.

Using the photoresist mask PM1, part of the first interlayer insulator SZa is etched away to form the aperture K1 in the first interlayer insulator SZa.

The aperture K1 is formed in the region of the first interlayer insulator SZa facing the light receiving surface JS of the photodiode 21 as illustrated in FIG. 6B.

The side wall of the aperture K1 is in parallel with the z direction perpendicular to the light receiving surface JS. The aperture K1 is formed in a manner such that the section of the aperture K1 in the xy plane in parallel with the light receiving surface JS is smaller than the area of the light receiving surface JS. The center line of the aperture K1 is also aligned with the center of the light receiving surface JS. The aperture K1 is formed through an anisotropic etching process.

For example, a reactive etching process may be performed using carbon tetraflouride ($CF_4$) gas or an anisotropic etching process may be performed using electron cyclotron resonance (ECR) plasma. The first interlayer insulator SZa is etched away until the surface of the photodiode 21 is exposed. The aperture K1 is thus formed. There is no particular limitation on the aspect ratio of the aperture K1.

An ashing process or the like is performed to remove the photoresist mask PM1.

Figure 7A:
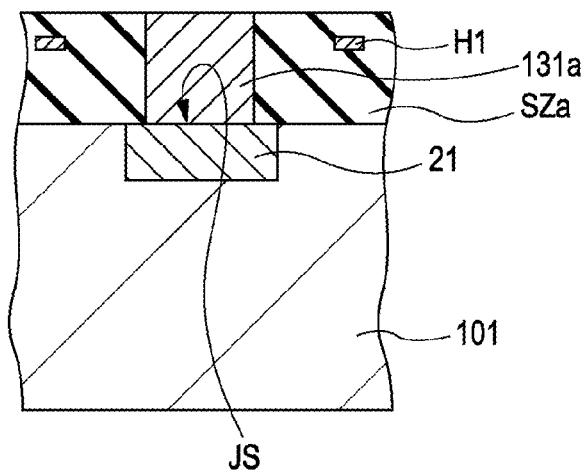
FIGS. 7A and 7B are sectional views illustrating a major portion of the solid-state imager in process steps in accordance with the first embodiment of the present invention.

Referring to FIG. 7A, the first waveguide member 131a is formed.

The first waveguide member 131a is formed within the aperture K1 that has been produced by partially removing the first interlayer insulator SZa.

The aperture K1 is filled with a silicon nitride (SiN) layer using the plasma CVD technique in the layer formation. After the layer formation, the surface of the formed layer is planarized using the chemical mechanical polishing (CMP) technique. The first waveguide member 131a is formed within the aperture K1 in this way.

Figure 7B:
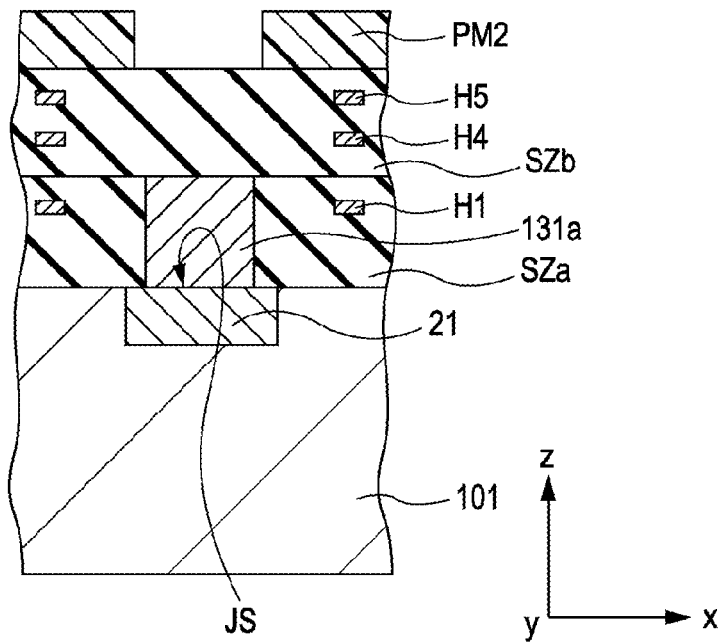

The second interlayer insulator SZb and a photoresist mask PM2 are formed as illustrated in FIG. 7B.

The second interlayer insulator SZb is formed to cover the first interlayer insulator SZa. As the first interlayer insulator SZa, the second interlayer insulator SZb is formed of a silicon oxide layer. The second wiring H2 and the third wiring H3 are formed within the second interlayer insulator SZb. The second wiring H2 and the third wiring H3 are formed through the damocene process.

As the photoresist mask PM1, the photoresist mask PM2 is formed on the second interlayer insulator SZb using the lithographic technique.

In accordance with the first embodiment, the photoresist mask PM2 is formed so that the surface of a region where the second waveguide member 131b is to be formed is exposed in the second interlayer insulator SZb with the remaining area covered.

Figure 8A:
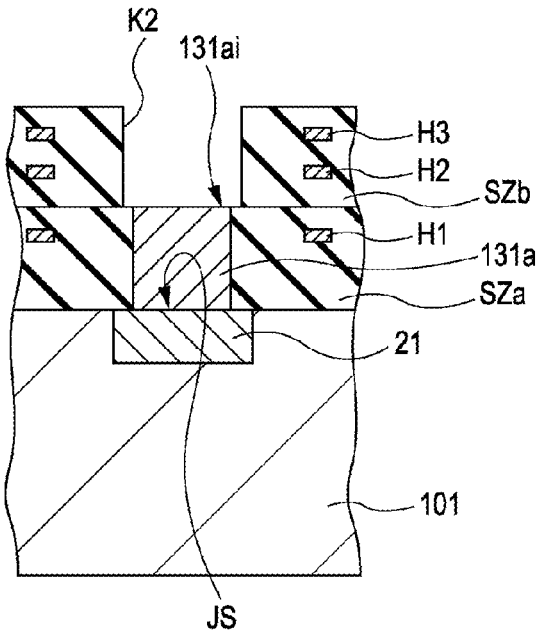
FIGS. 8A and 8B are sectional views illustrating a major portion of the solid-state imager in process steps in accordance with the first embodiment of the present invention.

An aperture K2 is formed as illustrated in FIG. 8A.

The aperture K2 is formed in the second interlayer insulator SZb by partially removing the second interlayer insulator SZb through the etching process using the photoresist mask PM2.

More specifically, the aperture K2 is opened in the second interlayer insulator SZb in a manner such that the aperture K2 faces the light incident surface 131ai of the first waveguide member 131a as illustrated in FIG. 8A.

In accordance with the first embodiment of the present invention, the side wall of the aperture K2 extends in the z direction perpendicular to the light receiving surface JS. The section of the aperture K2 in the xy plane in parallel with the light receiving surface JS is larger than the area of the light incident surface 131ai of the first waveguide member 131a. The center line of the aperture K2 through the xy plane in parallel with the light receiving surface JS is aligned with the center of the light receiving surface JS. As the aperture K1, the aperture K2 is formed through the anisotropic etching process. The photoresist mask PM2 is removed through the ashing process.

Figure 8B:
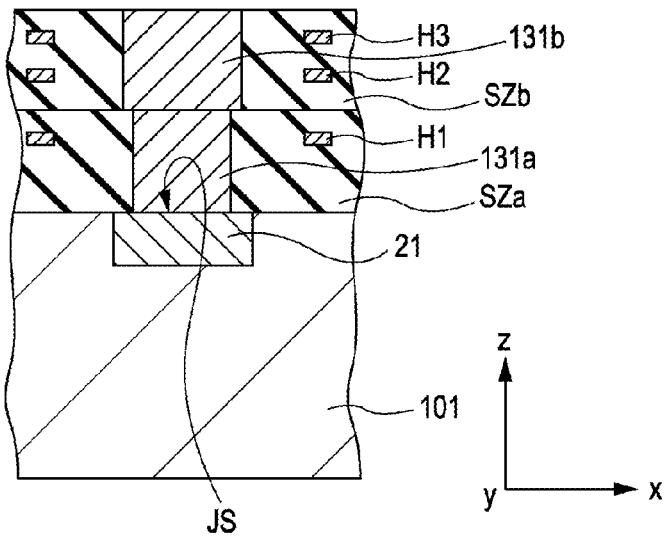

The second waveguide member 131b is formed as illustrated in FIG. 8B.

The second waveguide member 131b is formed within the aperture K2 that has been produced by partially removing the second interlayer insulator SZb. For example, the second waveguide member 131b is produced in the same way as the first waveguide member 131a is produced.

Figure 9A:
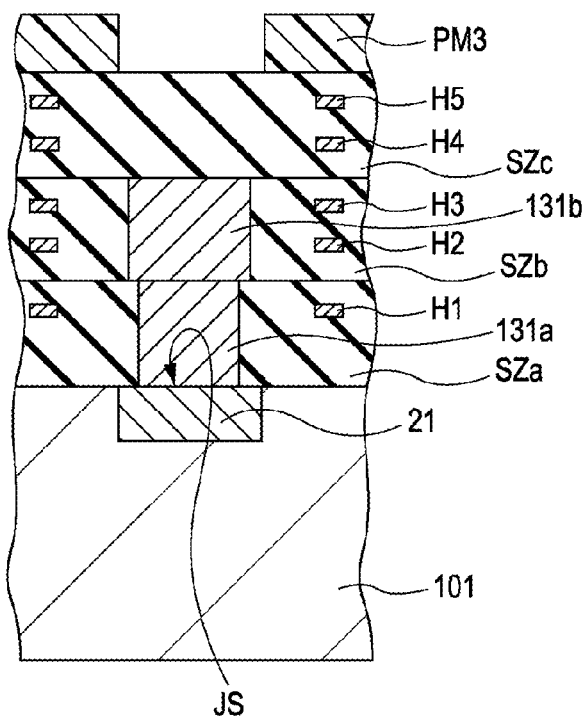
FIGS. 9A and 9B are sectional views illustrating a major portion of the solid-state imager in process steps in accordance with the first embodiment of the present invention.

The third interlayer insulator SZc and a photoresist mask PM3 are produced as illustrated in FIG. 9A.

The third interlayer insulator SZc is formed to cover the second interlayer insulator SZb. The third interlayer insulator SZc is manufactured of a silicon oxide in the same way as each of the first interlayer insulator SZa and the second interlayer insulator SZb is manufactured. The fourth wiring H4 and the fifth wiring H5 are embedded in the third interlayer insulator SZc. For example, the fourth wiring H4 and the fifth wiring H5 are produced using the damocene process.

The photoresist mask PM3 is formed on the third interlayer insulator SZc using the lithographic technique in the same way as the photoresist mask PM1 is formed.

In accordance with the first embodiment, the photoresist mask PM3 is formed so that the surface of a region where the third waveguide member 131c is to be formed is exposed in the third interlayer insulator SZc with the remaining area covered.

Figure 9B:
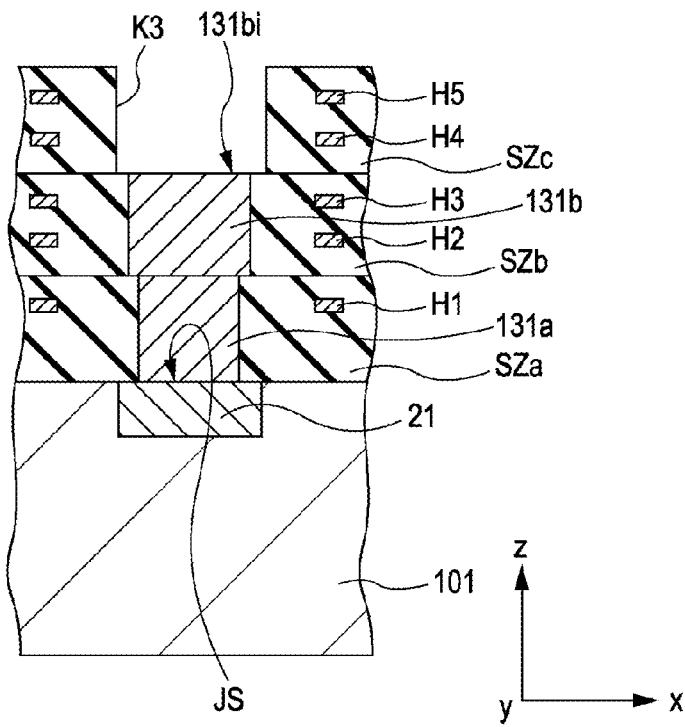

An aperture K3 is formed as illustrated in FIG. 9B.

The aperture K3 is formed in the third interlayer insulator SZc by partially etching away the third interlayer insulator SZc through the etching process using the photoresist mask PM3.

More specifically, with reference to FIG. 9B, the aperture K3 is formed in the third interlayer insulator SZc so that the aperture K3 faces the light incident surface 131bi of the second waveguide member 131b.

In accordance with the first embodiment of the present invention, the side wall of the aperture K3 is in parallel with the z direction. The section of the aperture K3 in the xy plane in parallel with the light receiving surface JS is larger in area than the light incident surface 131bi of the second waveguide member 131b. The center line of the aperture K3 perpendicular to the xy plane in parallel with the light receiving surface JS is aligned with the center of the light receiving surface JS. As the apertures K1 and K2, the aperture K3 is formed through the anisotropic etching process. The photoresist mask PM3 is then removed through the ashing process.

Figure 10:
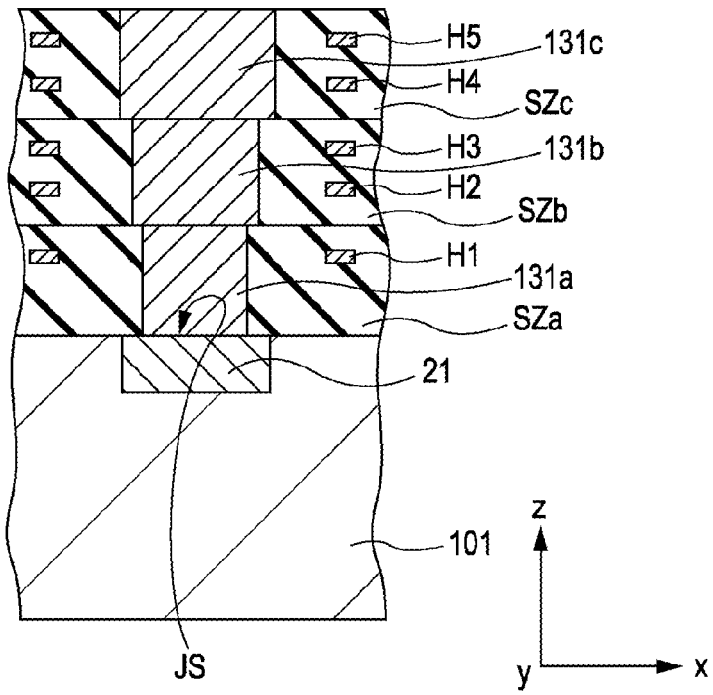
FIG. 10 is a sectional view illustrating a major portion of the solid-state imager in process steps in accordance with the first embodiment of the present invention.

The third waveguide member 131c is then formed as illustrated in FIG. 10.

The third waveguide member 131c of the waveguide path 131 is formed within the aperture K3 that has been formed by partially removing the third interlayer insulator SZc. For example, the third waveguide member 131c is formed in the same manner as each of the first waveguide member 131a and the second waveguide member 131b is formed.

The first waveguide member 131a, the second waveguide member 131b, and the third waveguide member 131c are successively formed on the light receiving surface JS. The waveguide path 131 is thus produced.

The color filter 301 and the micro lens 111 are produced as illustrated in FIG. 4.

The planarization layer HTa is formed on top of the surface bearing the waveguide path 131, and is then planarized.

The color filter 301 is then formed on top of the planarization layer HTa. For example, a coating liquid composed of a color pigment for each color and a photoresist resin is applied on the planarization layer HTa using the spin coating technique to form a coating layer. The coating layer is then patterned using the lithographic technique. The filter layer for each color forming the color filter 301 thus results.

The planarization layer HTb is formed to planarize the surface of the color filter 301.

The solid-state imager 1 is thus completed by forming the micro lens 111 onto the planarization layer HTb as illustrated in FIG. 4.

Conclusion

In accordance with the first embodiment of the present invention, the waveguide path 131 includes the first through third waveguide members 131a, 131b, and 131c laminated on the light receiving surface JS as illustrated in FIG. 4. If the waveguide path 131 is constructed of a single waveguide member, a high aspect ratio aperture is opened, possibly leading to a drop in reliability and production yield. In contrast, the waveguide path 131 of the first embodiment includes the plurality of waveguide members, namely, the first through third waveguide members 131a, 131b, and 131c, a reliable waveguide path results. The solid-state imager 1 of the first embodiment thus provides a high reliability and a high production yield.

In accordance with the first embodiment of the present invention, the light output surface 131ae of the first waveguide member 131a closest to the light receiving surface JS faces the light receiving surface JS. The light output surface 131ae of the first waveguide member 131a is smaller in area than the light incident surface 131ci of the third waveguide member 131c farthest from the light receiving surface JS. The light output surface 131ae of the first waveguide member 131a is smaller in area than the light receiving surface JS of the photodiode 21. In accordance with the first embodiment, the waveguide path 131 captures a large amount of light, thereby resulting in an increase in gain and controlling color mixing. Image quality is thus improved. High gain is obtained at full open F value and gain shading is less.

In accordance with the first embodiment of the present invention, the waveguide path 131 includes the waveguide members 131a, 131b, and 131c having the side walls thereof extending in the z direction perpendicular to the light receiving surface JS. Image quality is thus increased as will be described below.

Figure 11:
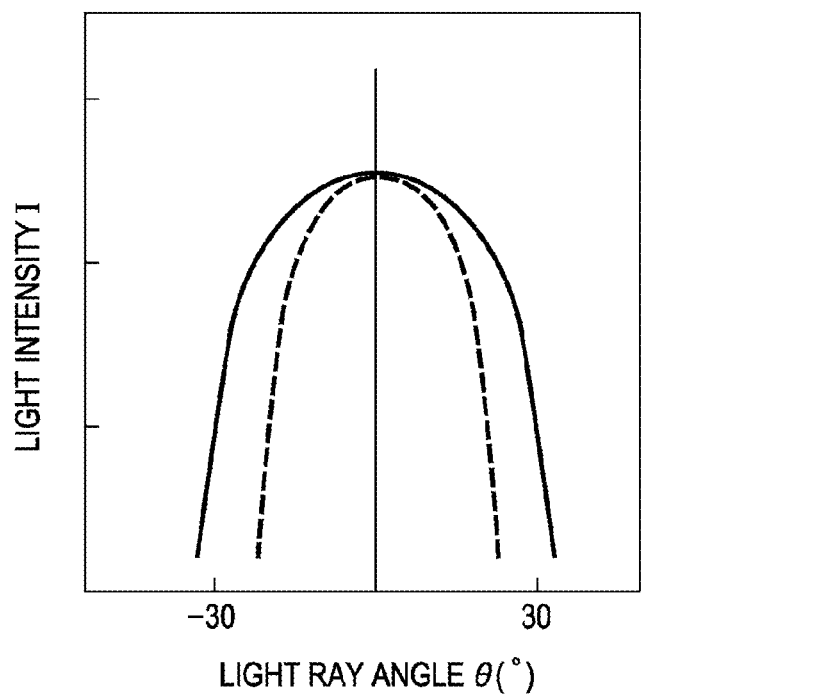
FIG. 11 illustrates the relationship between a light beam angle and a light intensity of light incident on a light receiving surface of the photodiode in accordance with the first embodiment of the present invention.

FIG. 11 illustrates the relationship between a light ray angle and a light intensity of light incident on the light receiving surface JS of the photodiode 21 in accordance with the first embodiment of the present invention. In FIG. 11, the abscissa represents the light ray angle $\theta°$ incident on the micro lens 111 with respect to the optical axis KJ of the micro lens 111, and the ordinate represents the light intensity I of the light incident on the light receiving surface JS of the photodiode 21.

The results provided by the solid-state imager 1 of the first embodiment of the present invention are represented by a solid line and the results of a comparative example are represented by a broken line.

Figure 12:
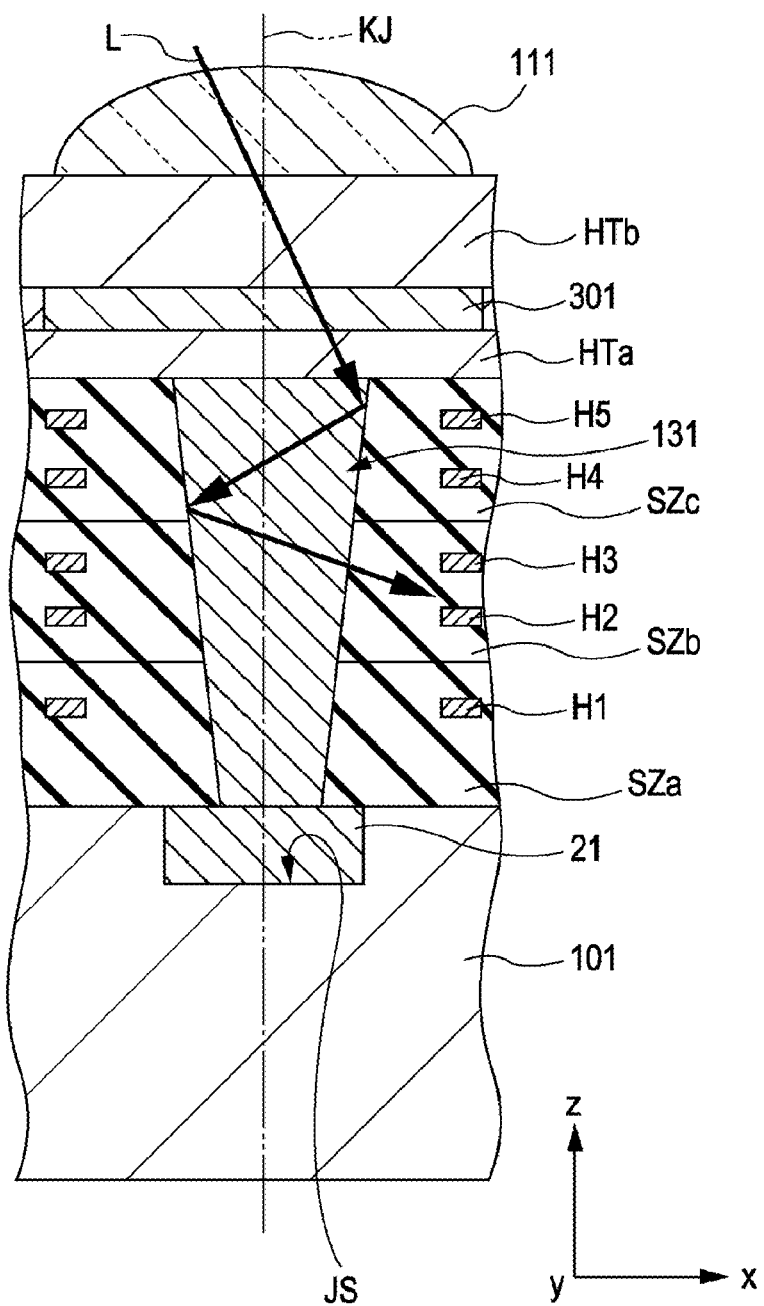
FIG. 12 is a sectional view illustrating a major portion of a solid-state imager serving as a comparative example in FIG. 11.

FIG. 12 is a sectional view illustrating a major portion of a solid-state imager used as the comparative example illustrated in FIG. 11. In FIG. 12, like elements are represented by like reference numerals.

Unlike the first embodiment of the present invention, the waveguide path 131 of the comparative example has a continuously tapered side wall with reference to the light receiving surface JS instead of straight vertical configuration to the light receiving surface JS. More specifically, the waveguide path 131 is continuously tapered toward the light receiving surface JS with the side wall thereof inclined, i.e., a section of the waveguide path 131 allowing the light to pass therethrough becomes smaller as it approaches the light receiving surface JS.

By comparison of the first embodiment with the comparative example as illustrated in FIG. 11, the waveguide path 131 having the side wall perpendicular to the light receiving surface JS allows the photodiode 21 to receive light at a high light intensity even with a broad light ray angle $\theta$.

Referring to FIG. 12, the side wall of the waveguide path 131 is inclined with respect to the light receiving surface JS in the comparative example. In such a case, an incident light beam L enters at a slant angle with respect to the optical axis KJ of the micro lens 111, is repeatedly reflected on the inclined side wall of the waveguide path 131 with the incident angle thereof changing each time, and then is output to the light receiving surface JS. More specifically, the incident light beam L changes the angle of progress thereof with respect to the xy plane in parallel with the light receiving surface JS. The incident light beam L is not reflected but transmitted through the side wall of the waveguide path 131 sometimes as illustrated in FIG. 12. Gain may drop, and light may enter another adjacent pixel and cause color mixing. Image quality may be degraded.

Figure 13:
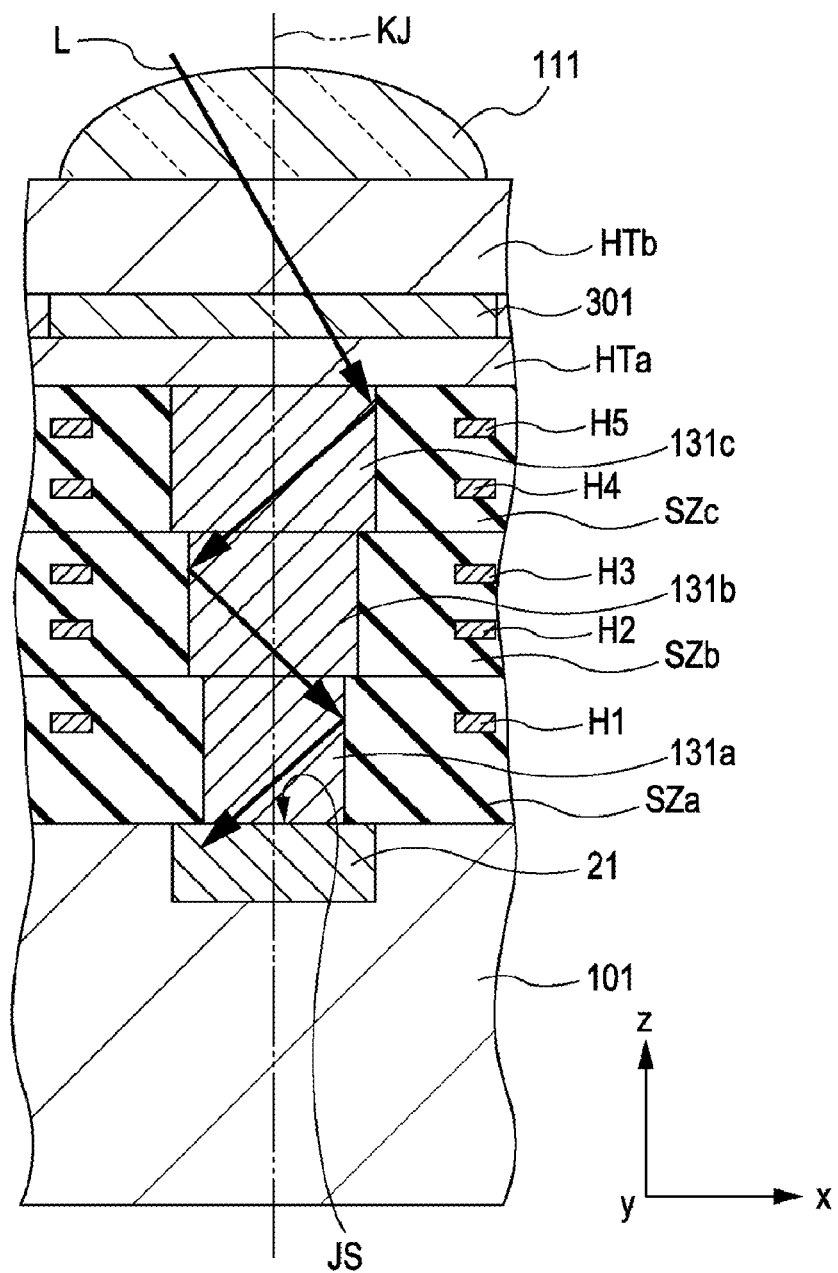
FIG. 13 is a sectional view illustrating how an incident light beam travels in a waveguide path of the solid-state imager in accordance with the first embodiment of the present invention.

FIG. 13 is a sectional view illustrating how the incident light beam L travels through the waveguide path 131 of the solid-state imager 1 of the first embodiment of the present invention.

In accordance with the first embodiment, the side wall of the waveguide path 131 is perpendicular to the light receiving surface JS. As illustrated in FIG. 13, an incident light beam L enters at a slant angle with respect to the optical axis KJ of the micro lens 111, is repeatedly totally reflected on the inclined side wall of the waveguide path 131 with a particular angle, and then is output to the light receiving surface JS. The waveguide path 131 is thus free from gain drop, color mixing due to light entering another adjacent pixel.

In accordance with the first embodiment of the present invention, the waveguide path 131 includes the waveguide members 131a, 131b, and 131c having the side walls extending in the z direction and defined by the steps Dab and Dbc and different in position in the xy plane in parallel with the light receiving surface JS. The waveguide members 131a, 131b, and 131c are arranged so that light emitted from the steps Dab and Dbc outside the waveguide path 131 re-enters the waveguide path 131 as evanescent light. The width dimension d of each of the steps Dab and Dbc is shorter than the wavelength of the light entering the waveguide path 131.

Figure 14A:
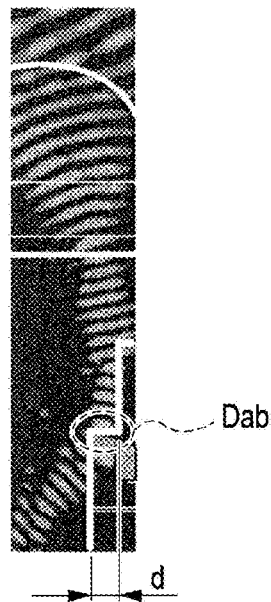
FIGS. 14A-14D illustrate how the light beam incident on the waveguide path travels through a step of the waveguide path in accordance with the first embodiment of the present invention.
Figure 14B:
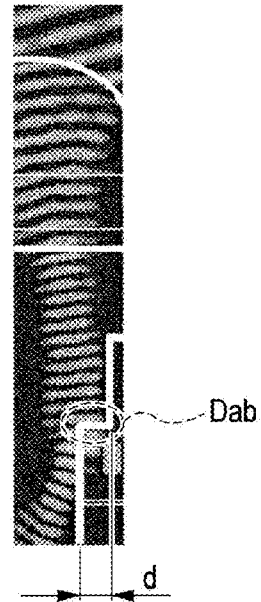

FIGS. 14A-14B illustrate how the light incident on the waveguide path 131 travels through the step Dab in accordance with the first embodiment of the present invention.

Figure 14C:
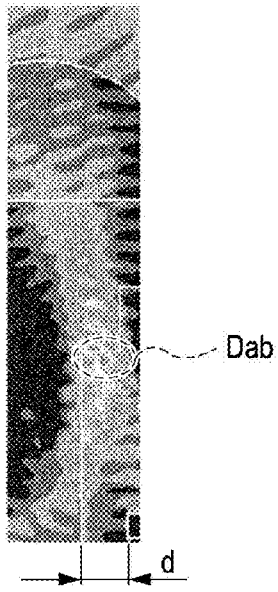
Figure 14D:
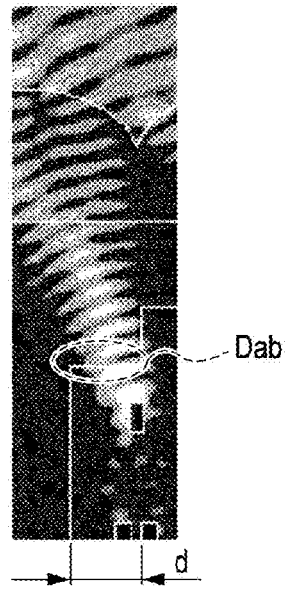

FIG. 14A illustrates the results obtained in a condition (a), and FIG. 14B illustrates the results obtained in a condition (b). In the conditions (a) and (b), the width dimension d of the step Dab is shorter than the wavelength of the incident light. FIG. 14C illustrates the results obtained in a condition (c) in which the width dimension d of the step Dab is equal to or longer than half the wavelength of the incident light. FIG. 14D illustrates the results obtained in a condition (d). FIGS. 14A-14D illustrate images indicating a value that is obtained by squaring an electric field intensity in optical simulation performed using wave simulator based on finite difference time domain (FDTD) method. FIGS. 14A-14D are different in scale for convenience of illustration. The slant angle of the incident light is a slant angle with respect to a line perpendicular to the light receiving surface JS.

Condition (a)
Wavelength of the incident light: 550 nm
Slant angle of the incident light: 25°
Refraction index of the waveguide members 131a, 131b, and 131c: 1.7
Refraction index of the interlayer insulators SZa, SZb, and SZc (clad): 1.45
Width dimension of the step Dab d: 100 nm
Condition (b)
Slant angle of the incident light: 15°
Rest of the condition identical to condition (a)
Condition (c)
Width dimension of the step Dab d: 300 nm
Rest of the condition identical to condition (a)
Condition (d)
Width dimension of the step Dab d: 600 nm
Slant angle of the incident light: 30°
Rest of the condition identical to condition (a)

If the width dimension d of the step Dab is shorter than the wavelength of the incident light as illustrated in FIG. 14A-14C, the incident light travels along the xy plane. Even if the light is partially emitted from the step Dab, the emitted light re-enters the waveguide path 131 as evanescent light. If the width dimension d of the step Dab is about half the wavelength of the incident light, the emitted light more appropriately re-enters the waveguide path 131.

More specifically, if the width dimension d of the step Dab (100 nm) is shorter than the wavelength of the incident light (550 nm) in the condition (a) as illustrated in FIG. 14A, light hits the wider aperture on the top. The incident light is reflected toward the center of the photodiode 21 and then enters the lower aperture and the step Dab, and is then transmitted. Even if the main light beam is incident at a slant angle, the light main light beam travels and bends toward the center of the photodiode 21.

If the angle of incidence of the incident light is small (as small as 15°) as in the condition (b) illustrated in FIG. 14B in contrast to the condition (a), more incident light directly enters the step Dab than in the condition (a). Even if the incident light enters the step Dab as in FIG. 14B, the light is refracted toward the photodiode 21.

In the condition (c) illustrated in FIG. 14C, the width dimension of the step Dab (300 nm) exceeds half the wavelength of the incident light (550 nm). The light leaks out of the waveguide path 131 and then returns to the waveguide path 131 at the lower waveguide member. Part of the light fails to return, and gain loss occurs in comparison with the conditions (a) and (b). In order to cause the light to travel efficiently the waveguide path 131 with loss controlled, the width dimension d of the step is preferably about half or shorter than the wavelength of the incident light.

In the condition (d) illustrated in FIG. 14D, the width dimension d of the step Dab is equal to or longer than the wavelength of the incident light. The incident light travels in the xy plane at the step Dab. If part of the light is emitted out of the waveguide path 131, the emitted light fails to re-enter the waveguide path 131 as evanescent light.

In accordance with the first embodiment of the present invention, the light travels properly within the waveguide path 131 and is output to the light receiving surface JS. Image quality of a captured image is improved.

Second Embodiment

Apparatus Structure

Figure 15:
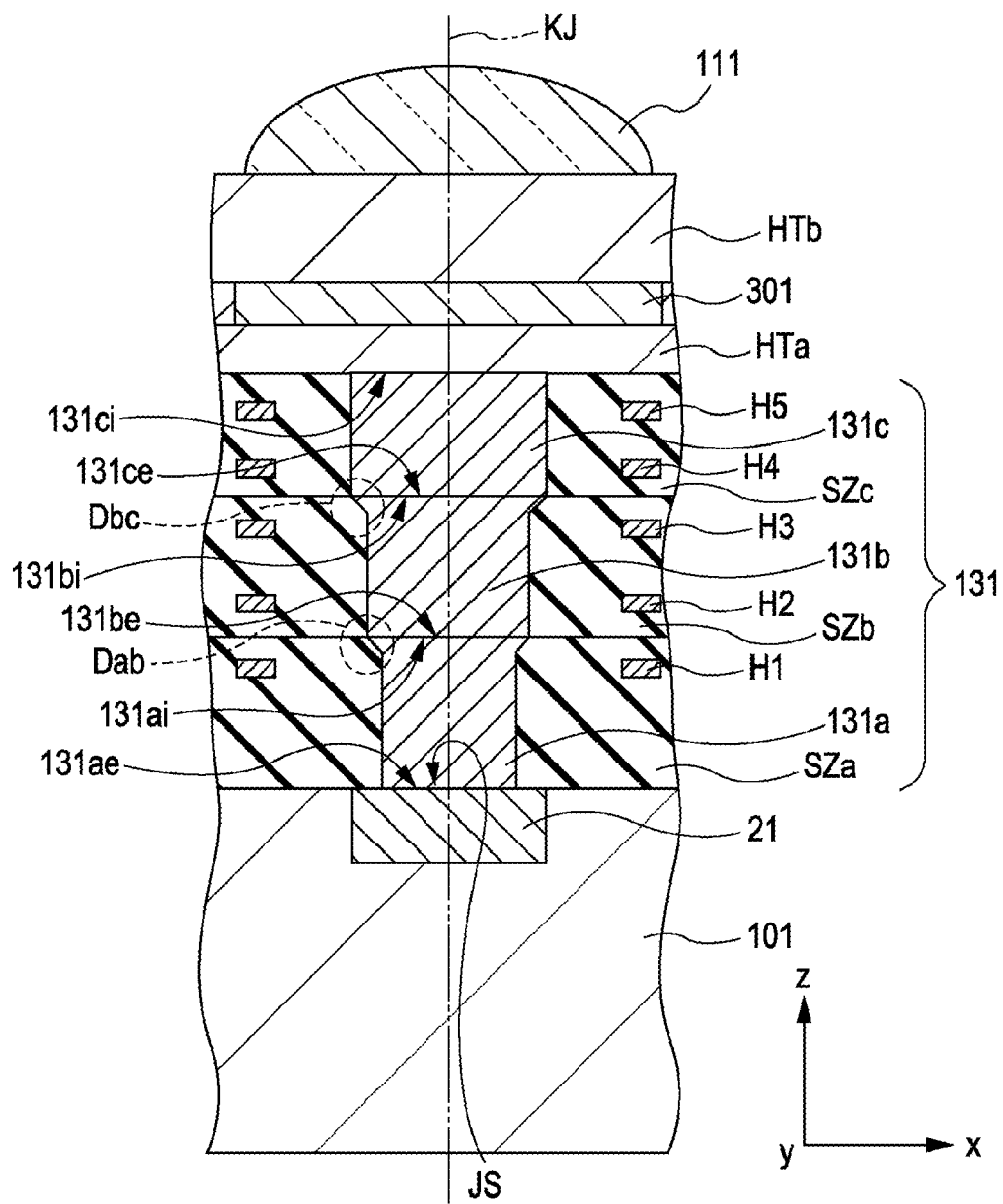
FIG. 15 is a sectional view of a major portion of a solid-state imager in accordance with a second embodiment of the present invention.

FIG. 15 is a sectional view illustrating a major portion of a solid-state imager 1 in accordance with a second embodiment of the present invention. As FIG. 4, FIG. 15 illustrates a section of a pixel P.

Referring to FIG. 15, the waveguide path 131 is different from the counterpart in the first embodiment. The rest of the structure of the solid-state imager 1 of the second embodiment remains unchanged from that of the first embodiment. Like elements are designated with like reference numerals.

As the waveguide path 131 of the first embodiment, the waveguide path 131 of the second embodiment includes the first through third waveguide members 131a, 131b, and 131c.

In the waveguide path 131, the side walls of the first through third waveguide members 131a, 131b, and 131c are arranged in different positions in the xy plane so that the steps Dab and Dbc are formed in the z direction perpendicular to the light receiving surface JS.

In the waveguide path 131 of the second embodiment, the steps Dab and Dbc are tapered at a slant angle with respect to the z direction perpendicular to the light receiving surface JS. The straight vertical side walls of the waveguide path 131 occupy at least half the total area of the side walls and the tapered step areas occupy less than half the total area of the side walls.

More specifically, the light incident surface 131ai is larger in area than the light output surface 131ae in the first waveguide member 131a as illustrated in FIG. 15. The first waveguide member 131a has the side wall perpendicular to the light receiving surface JS extending from the bottom end portion to close to the top end portion and the reverse tapered wall in the top end portion with height.

The light incident surface 131bi is larger in area than the light output surface 131be in the second waveguide member 131b as illustrated in FIG. 15. The light output surface 131be of the second waveguide member 131b is identical in shape to the light incident surface 131ai of the first waveguide member 131a. The second waveguide member 131b has the side wall perpendicular to the light receiving surface JS extending from the bottom end portion to close to the top end portion and the reverse tapered wall in the top end portion with height.

The light output surface 131ce of the third waveguide member 131c is identical in shape to the light incident surface 131bi of the second waveguide member 131b. The third waveguide member 131c has the side wall perpendicular to the light receiving surface JS extending from the bottom end to the top end.

Manufacturing Method

A method of manufacturing the above-described solid-state imager 1 is described below.

FIGS. 16A and 16B through FIGS. 19A and 19B are sectional views of major portions of the solid-state imager 1 at process steps in accordance with the second embodiment of the present invention.

Referring to FIG. 16A, the first interlayer insulator SZa and the photoresist mask PM1 are formed.

The first interlayer insulator SZa is formed subsequent to the formation of the photodiode 21 in the same manner as in the first embodiment. The first interlayer insulator SZa is formed to cover the photodiode 21 in the substrate 101.

The photoresist mask PM1 is formed using the lithographic technique.

In accordance with the second embodiment of the present invention, the photoresist mask PM1 is formed so that the surface of a region where the vertical side wall of the first waveguide member 131a is to be formed is exposed in the first interlayer insulator SZa with the remaining area covered.

As illustrated in FIG. 16B, an aperture K1a is formed.

Using the photoresist mask PM1, part of the first interlayer insulator SZa is etched away to form the aperture K1a in the first interlayer insulator SZa.

In accordance with the second embodiment, the aperture K1a is formed in a manner such that the aperture K1a is reversed tapered with height in the z direction perpendicular to the light receiving surface JS. More specifically, the aperture K1a is formed through the isotropic etching process.

For example, the first interlayer insulator SZa is partially etched to a depth of about 100 nm using plasma containing carbon tetraflouride ($CF_4$) gas. In this case, the first interlayer insulator SZa is etched to the same extent in a horizontal direction as in a vertical direction.

Figure 17A:
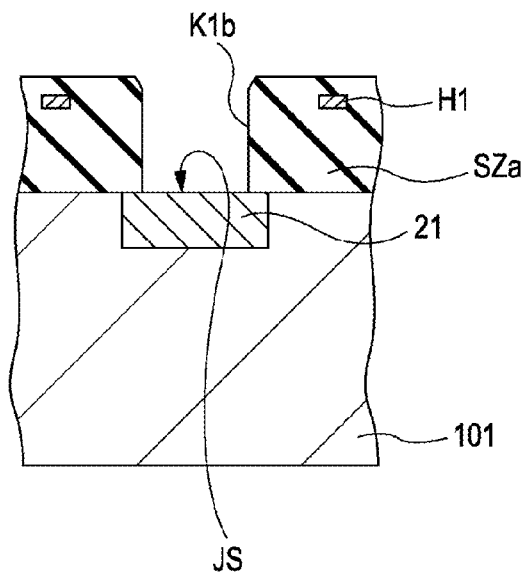
FIGS. 17A and 17B are sectional views illustrating a major portion of the solid-state imager in process steps in accordance with the second embodiment of the present invention.

An aperture K1b is then formed as illustrated in FIG. 17A.

The first interlayer insulator SZa is partially etched away using the photoresist mask PM1. The aperture K1b is thus formed through the first interlayer insulator SZa from the top to the bottom end thereof.

In accordance with the second embodiment of the present invention, the side inner wall of the aperture K1b is in parallel with z direction perpendicular to the light receiving surface JS. The aperture K1b is thus formed so that a section of the aperture K1b in the xy plane in parallel with the light receiving surface JS is smaller in area than the light receiving surface JS. The center axis of the aperture K1b is aligned with the center of the light receiving surface JS. The aperture K1b is formed through the anisotropic etching process in the same manner as in the first embodiment of the present invention.

An ashing process or the like is performed to remove the photoresist mask PM1. The etching process is performed until the surface of the photodiode 21 is exposed. Optionally, the etching process may be stopped in the middle before the exposure of the surface of the photodiode 21.

Figure 17B:
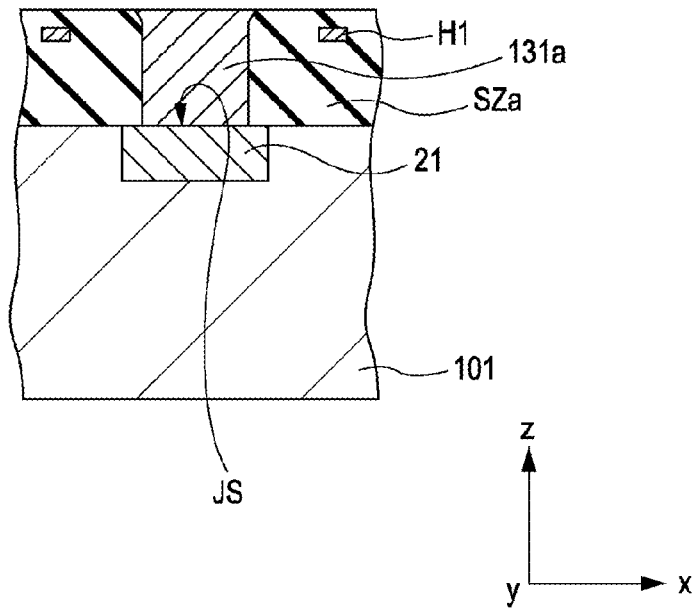

Referring to FIG. 17B, the first waveguide member 131a is formed.

The first waveguide member 131a is formed within the apertures K1a and K1b that have been produced by partially removing the first interlayer insulator SZa.

The apertures K1a and K1b are filled with a silicon nitride (SiN) layer using the plasma CVD technique in the layer formation. After the layer formation, the surface of the formed layer is planarized through the CMP process. The first waveguide member 131a is formed within the apertures K1a and K1b in this way.

Figure 18A:
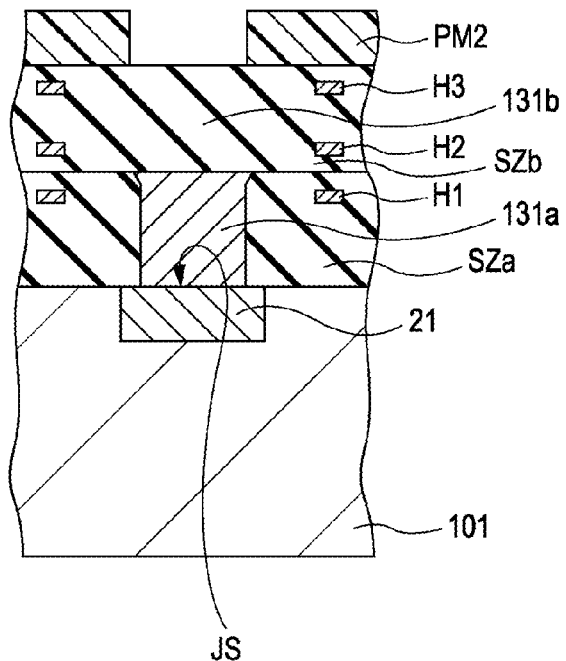
FIGS. 18A and 18B are sectional views illustrating a major portion of the solid-state imager in process steps in accordance with the second embodiment of the present invention.

The second interlayer insulator SZb and the photoresist mask PM2 are formed as illustrated in FIG. 18A.

The second interlayer insulator SZb is formed to cover the first interlayer insulator SZa. As in the first embodiment, the second interlayer insulator SZb is manufactured of a silicon oxide layer.

As the photoresist mask PM1, the photoresist mask PM2 is formed on the second interlayer insulator SZb using the lithographic technique.

In accordance with the second embodiment, the photoresist mask PM2 is formed so that the surface of a region where the surface of the vertical side wall of the second waveguide member 131b is to be formed is exposed in the second interlayer insulator SZb with the remaining area covered.

Figure 18B:
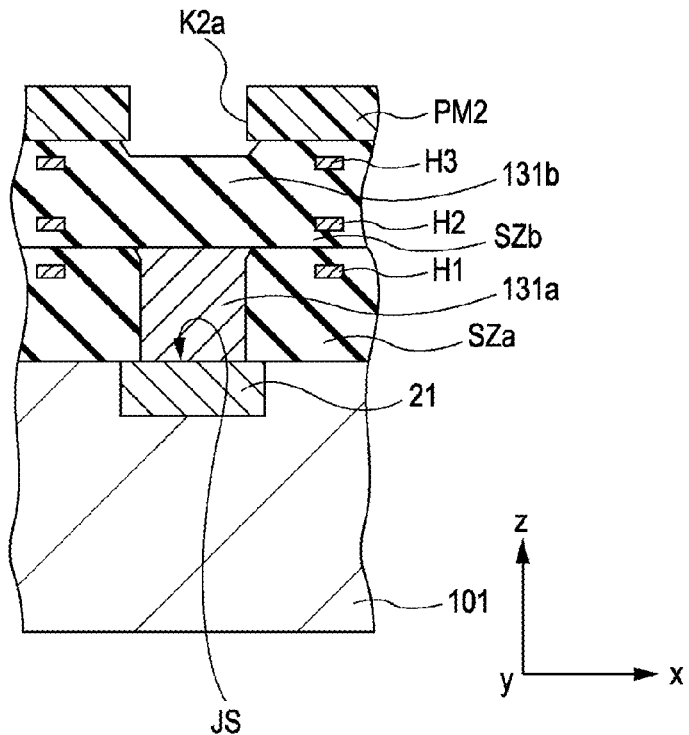

An aperture K2a is formed as illustrated in FIG. 18B.

More specifically, the aperture K2a is opened in the second interlayer insulator SZb by partially etching away the second interlayer insulator SZb using the photoresist mask PM2.

In the same manner as the aperture K1a is formed, the aperture K2a is formed so that the aperture K2a is reversed tapered with height in the z direction perpendicular to the light receiving surface JS. More specifically, the aperture K2a is formed through the isotropic etching process.

Figure 19A:
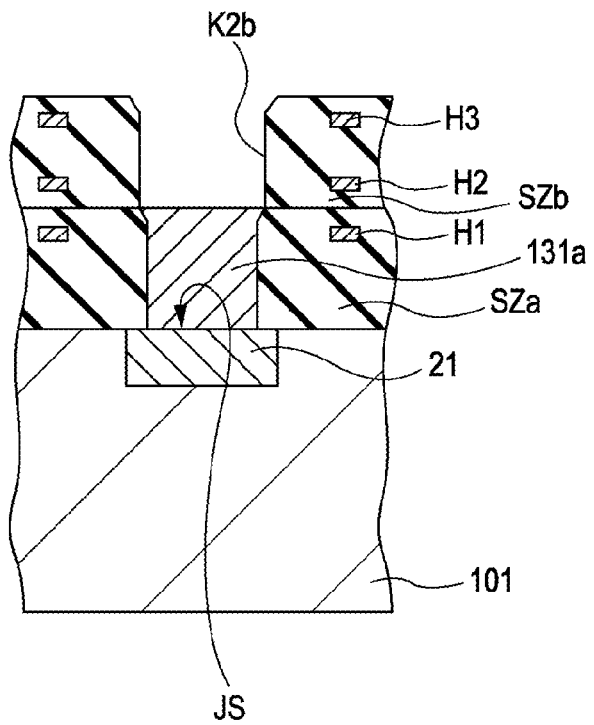
FIGS. 19A and 19B are sectional views illustrating a major portion of the solid-state imager in process steps in accordance with the second embodiment of the present invention.

An aperture K2b is then formed as illustrated in FIG. 19A.

The second interlayer insulator SZb is partially etched away using the photoresist mask PM2. The aperture K2b is thus formed from the top side to the bottom side of the second interlayer insulator SZb.

In accordance with the second embodiment of the present invention, the side inner wall of the aperture K2b is in parallel with z direction perpendicular to the light receiving surface JS. The aperture K2b is thus formed so that the section thereof in the xy plane in parallel with the light receiving surface JS is identical in area to the light incident surface 131ai of the first waveguide member 131a. The center axis of the aperture K2b is aligned with the center of the light receiving surface JS. The aperture K2b is formed through the anisotropic etching process in the same manner as in the first embodiment of the present invention.

An ashing process or the like is performed to remove the photoresist mask PM2.

Figure 19B:
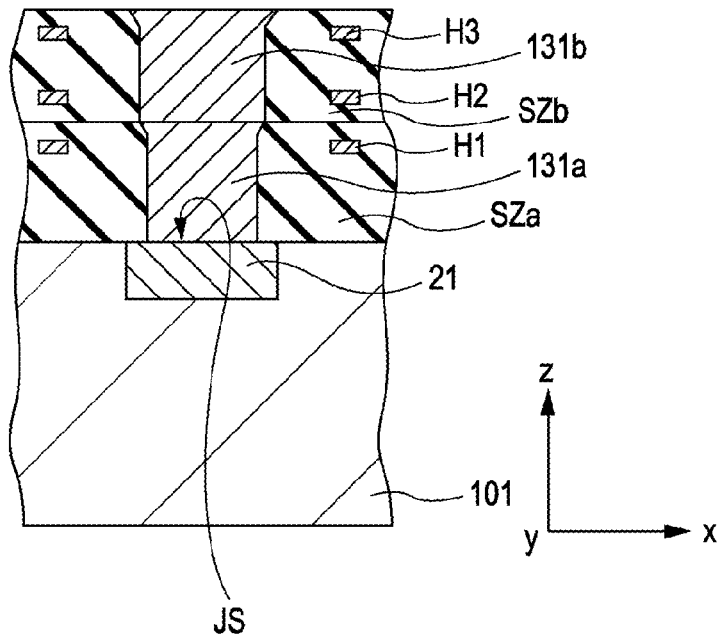

The second waveguide member 131b is formed as illustrated in FIG. 19B.

The second waveguide member 131b is formed within the apertures K2a and K2b that have been produced by partially removing the second interlayer insulator SZb.

For example, the second waveguide member 131b is formed within the apertures K2a and K2b in the same manner as the first waveguide member 131a is formed.

As in the first embodiment, the third interlayer insulator SZc, the color filter 301 and the micro lens 111 are formed to complete the solid-state imager 1.

Conclusion

In accordance with the second embodiment, the waveguide path 131 includes the steps Dab and Dbc having a tapered surface at a slant angle with respect to the z direction perpendicular to the light receiving surface JS.

Figure 20:
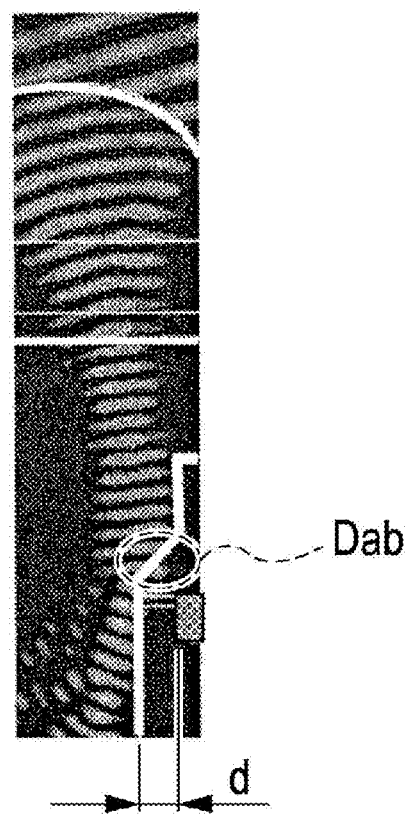
FIG. 20 illustrates how a light beam incident on the waveguide path travels through a step of the waveguide path in accordance with the second embodiment of the present invention.

FIG. 20 illustrates how an incident light beam incident on the waveguide path 131 travels through the step Dab in accordance with the second embodiment of the present invention.

FIG. 20 illustrates simulation results in a condition (e). More specifically, FIG. 20 illustrates an image indicating a value that is obtained by squaring an electric field intensity in optical simulation performed using wave simulator based on finite difference time domain (FDTD) method.

Condition (e)
Wavelength of the incident light: 550 nm
Slant angle of the incident light: 25°
Refraction index of the first waveguide members 131a, 131b, and 131c: 1.7
Refraction index of the first interlayer insulators SZa, SZb, and SZc (clad): 1.45 (silicon oxide layer)
Width dimension of the step Dab d: 100 nm
Taper angle of the step Dab: 45°

Light travels within the waveguide path 131 because the step Dab has a tapered surface slant with respect to the z direction perpendicular to the light receiving surface JS as illustrated in FIG. 20. More specifically, light traveling as a wave is collected by the on-chip micro lens, and enters the taper portion of the waveguide path 131, where the light is bent toward the center of the photodiode 21.

In accordance with the second embodiment of the present invention, light reliably travels within the waveguide path 131 and reaches the light receiving surface JS. The solid-state imager 1 of the second embodiment thus increases image quality of the captured image in the same way as the solid-state imager 1 of the first embodiment.

Third Embodiment

Apparatus Structure

Figure 21:
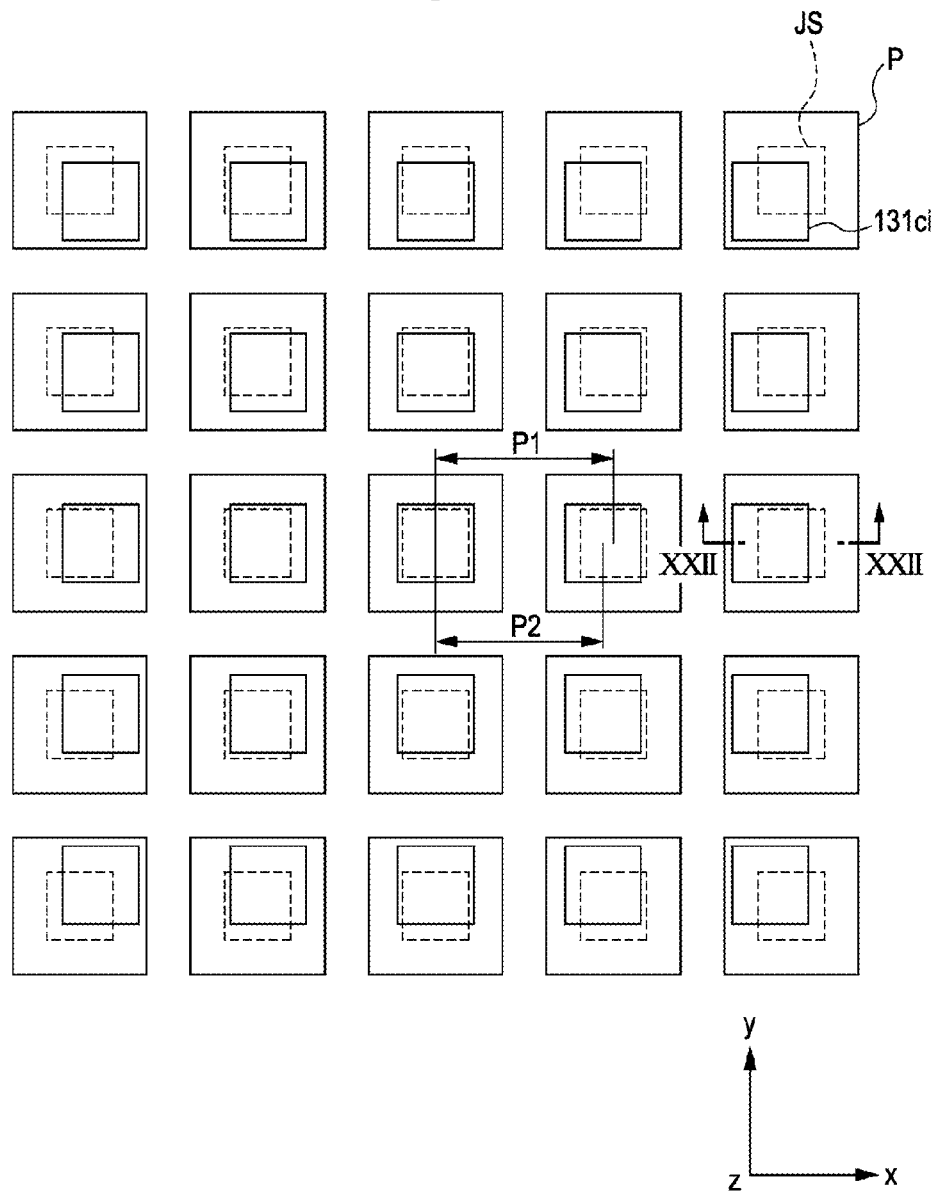
FIG. 21 is a plan view illustrating the relationship between a pixel and the light incident surface of a waveguide path in accordance with a third embodiment of the present invention.
Figure 22:
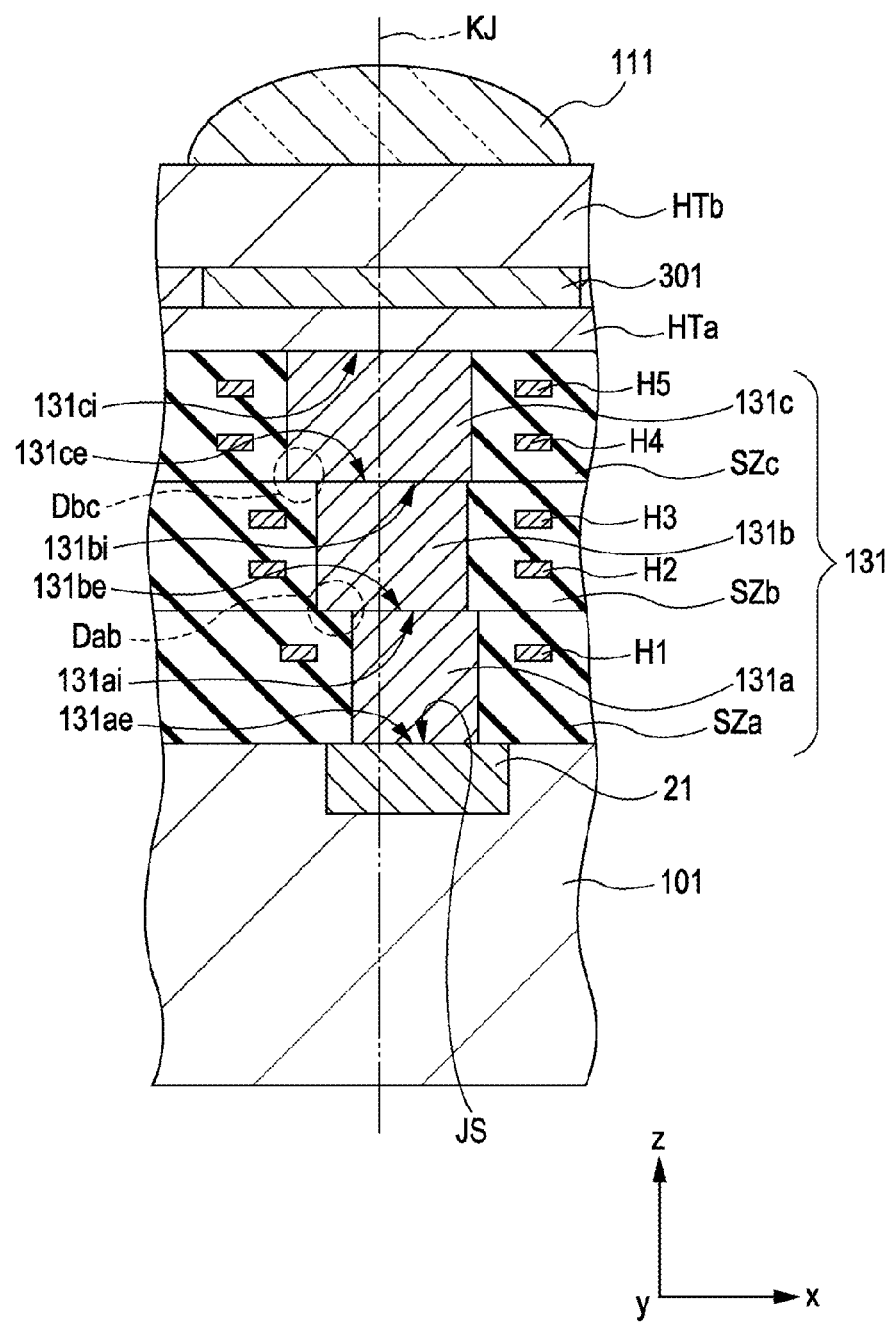
FIG. 22 is a sectional view illustrating a major portion of the solid-state imager in accordance with the third embodiment of the present invention.

FIG. 21 is a plan view illustrating the relationship between the pixel P and the light incident surface 131ci of the waveguide path 131 in accordance with a third embodiment of the present invention. FIG. 22 is a sectional view of a major portion of the solid-state imager 1 of the third embodiment of the present invention. As FIG. 4, FIG. 22 illustrates a section of the pixel P taken along line XXII-XXII in FIG. 21.

Referring to FIG. 21, the relationship between the pixel P and the light incident surface 131ci of the third waveguide member 131c in the third embodiment is different from that in the first embodiment of the present invention. Referring to FIG. 22, the shape of the waveguide path 131, the positions of the micro lens 111, the color filter 301, and the wirings H1, H2, H3, H4, and H5 in the third embodiment are different from those in the first embodiment. More specifically, the positional relationship of the elements is adjusted through "pupil correction." The rest of the third embodiment is identical to the first embodiment, and the discussion of structures of the third embodiment identical to those of the first embodiment is omitted here.

Referring to FIG. 21, a plurality of pixels P are arranged in a matrix on the imaging region PA of the substrate 101.

The light receiving surfaces JS of the plurality of photodiodes 21 are arranged in the x direction and the y direction with a first pitch P1 identical to the pitch of the plurality of pixels P. More specifically, the light receiving surfaces JS of the photodiodes 21 are arranged from the center of the imaging region PA in the x direction and the y direction so that the distance between the centers of every two adjacent light receiving surfaces JS is equal to the distance between the centers of every two adjacent pixels P.

The plurality of waveguide paths 131 are arranged with a second pitch P2 smaller than the first pitch P1 with the light incident surface 131ci of the third waveguide member 131c within the respective pixel P as illustrated in FIG. 21. More specifically, the third waveguide members 131c are arranged from the center of the imaging region PA in the x direction and the y direction so that the distance between the centers of every two adjacent light incident surfaces 131ci is shorter than the distance between the centers of every two adjacent pixels P. For example, the light incident surfaces 131ci of the waveguide paths 131 are arranged with the second pitch P2 that is coaxially adjusted in response to an angle of a light beam output from an optical lens forming the optical system 42.

Also in the waveguide path 131, the light output surface 131ae of the first waveguide member 131a is formed to face the light receiving surface JS as illustrated in FIG. 22. The light output surface 131ae of the first waveguide member 131a is thus shifted in position from the light incident surface 131ci of the third waveguide member 131c in the xy plane. In accordance with the third embodiment, the light output surfaces 131ae of the first waveguide members 131a are arranged with the first pitch P1. The distance between the centers of every two adjacent light output surfaces 131ae is equal to the distance between the centers of every two adjacent light receiving surfaces JS and the distance between the centers of every two adjacent pixels P.

In the waveguide path 131 as illustrated in FIG. 22, the light output surface 131be of the second waveguide member 131b is shifted from the light incident surface 131ci of the third waveguide member 131c in the xy plane. In accordance with the third embodiment, the light output surfaces 131be of the second waveguide members 131b are arranged with a pitch somewhere between the first pitch P1 and the second pitch P2.

As illustrated in FIG. 22, the wirings H1, H2, H3, H4, and H5 are lined in the z direction perpendicular to the light receiving surface JS. In accordance with the third embodiment, the wirings H1, H2, H3, H4, and H5 are also shifted so that the wirings H1, H2, H3, H4, and H5 are spaced from the side walls of the respective waveguide members 131a, 131b, and 131c.

The micro lens 111 is arranged as illustrated in FIG. 22 so that the optical axis KJ thereof is aligned with the center of the light incident surface 131ci of the third waveguide member 131c.

The color filter 301 is arranged as illustrated in FIG. 22 so that the center thereof is aligned with the optical axis KJ of the micro lens 111.

Conclusion

In accordance with the third embodiment of the present invention, the third waveguide members 131c are arranged so that the light incident surfaces 131ci are spaced with the second pitch P2 smaller than the first pitch P1 of the pixels P. The wirings H1, H2, H3, H4, and H5 are also shifted accordingly.

The solid-state imager 1 of the third embodiment thus prevents optical shading from being generated, thereby increasing image quality.

Fourth Embodiment

Apparatus Structure

Figure 23:
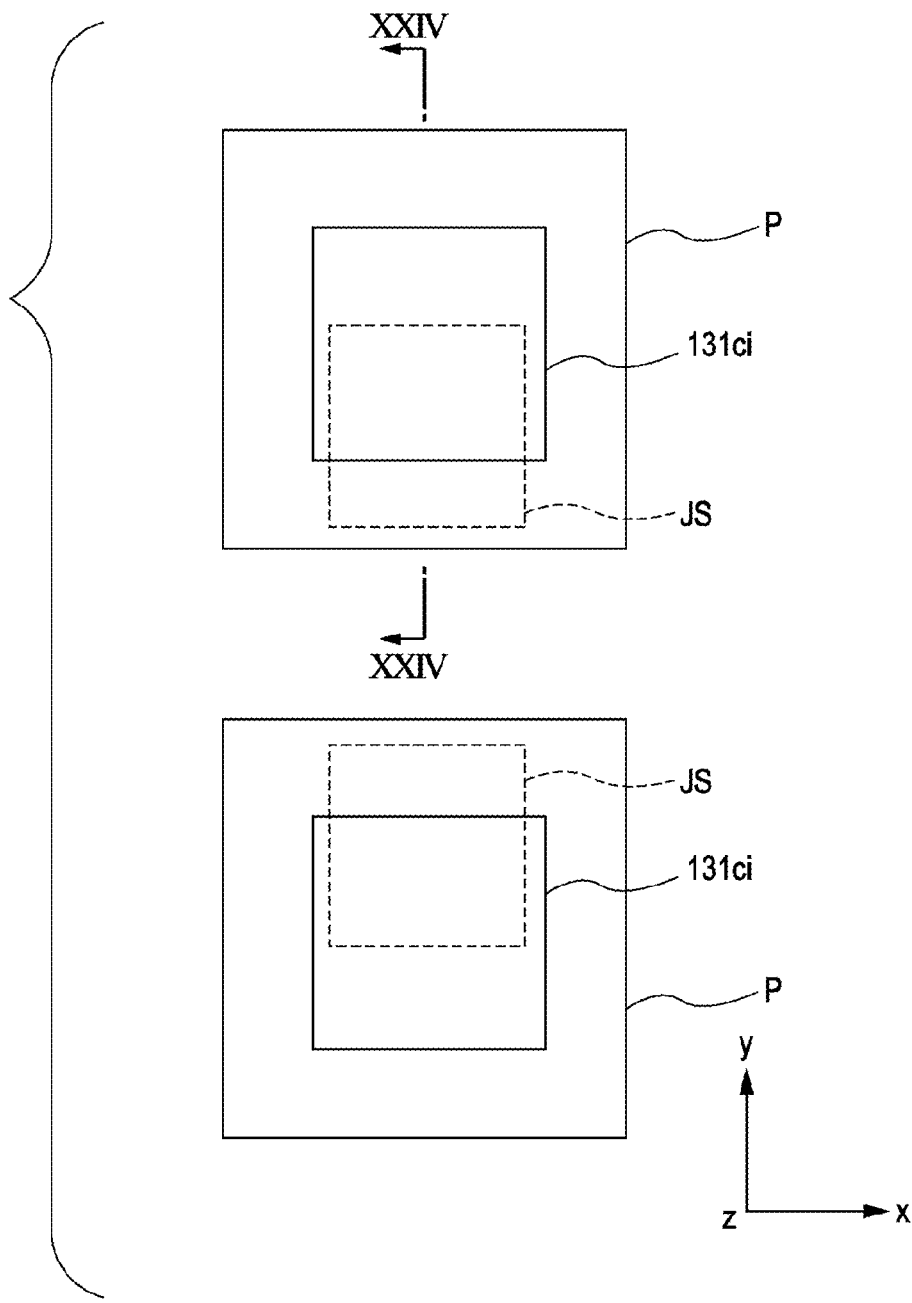
FIG. 23 is a plan view illustrating a pixel in accordance with a fourth embodiment of the present invention.
Figure 24:
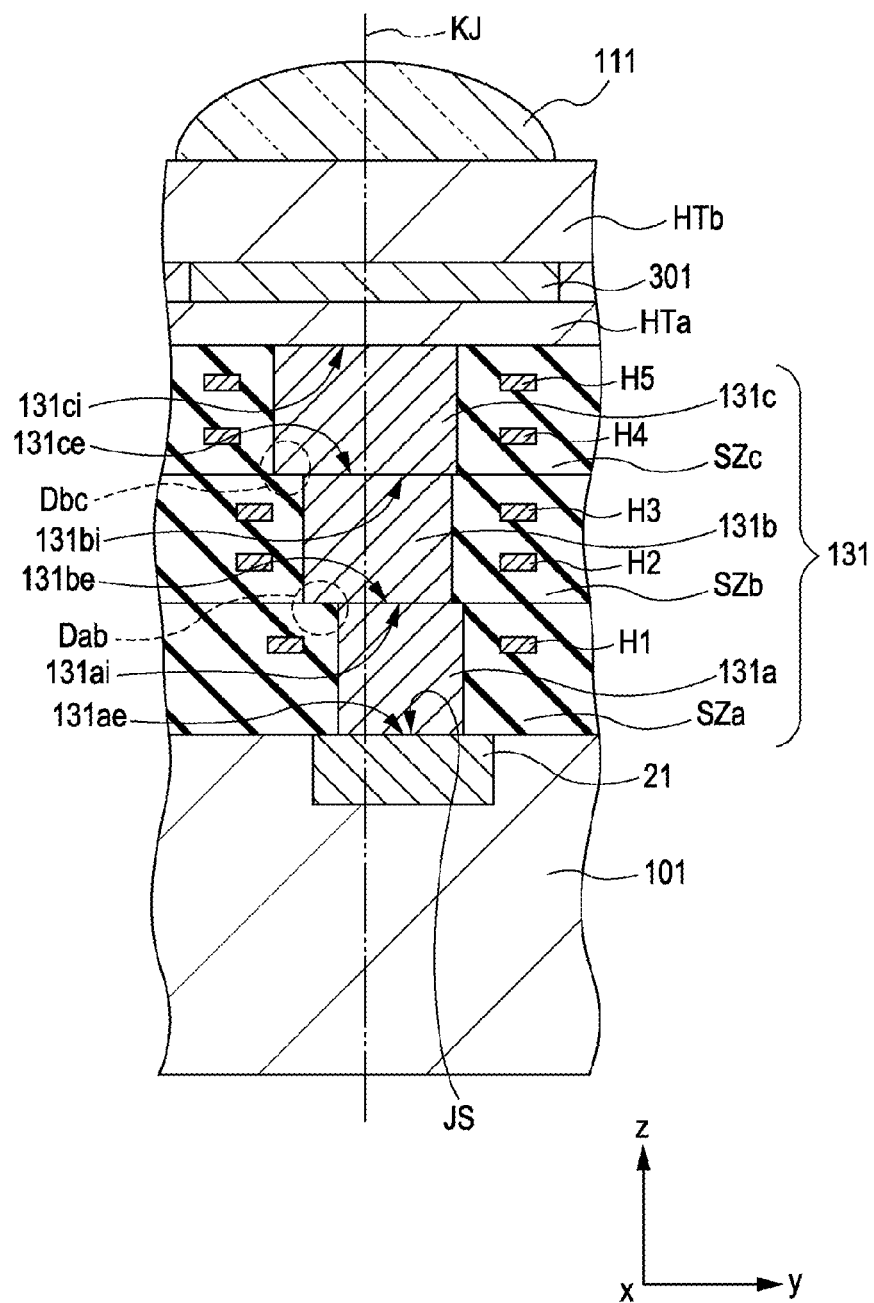
FIG. 24 is a sectional view of a major portion of the solid-state imager in accordance with the fourth embodiment of the present invention.

FIG. 23 is a plan view of the pixel P in accordance with a fourth embodiment of the present invention. FIG. 24 is a sectional view illustrating a major portion of a solid-state imager 1 in accordance with the fourth embodiment of the present invention. As FIG. 4, FIG. 24 illustrates a section of the pixel P taken along line XXIV-XXIV in FIG. 23.

Referring to FIG. 23, the relationship between the light receiving surface JS of the photodiode 21 and the light incident surface 131ci of the third waveguide member 131c in the fourth embodiment is different from that in the first embodiment. Referring to FIG. 24, the shape of the waveguide path 131 in the fourth embodiment is different from that in the first embodiment. The rest of the structure of the solid-state imager 1 of the fourth embodiment is identical to that of the first embodiment and the discussion thereof is omitted here.

In view of a pair of pixels P illustrated in FIG. 23, the photodiodes 21 are arranged so that the light receiving surfaces JS are shifted to be closer to each other from the center of the pixel P. Transfer transistors (not shown) are arranged in each pixel P, and pixel transistors other than the transfer transistors are shared by the pair of pixels P.

Referring to FIG. 23, the center of the light incident surface 131ci of the third waveguide member 131c is aligned with the center of the pixel P in the waveguide path 131 forming each of the pixels P.

Referring to FIG. 24, the light output surface 131ae of the first waveguide member 131a is formed to face the light receiving surface JS and is shifted in the xy plane from the light incident surface 131ci of the third waveguide member 131c.

Also referring to FIG. 24, the light output surface 131be of the second waveguide member 131b is shifted in the xy plane from the light incident surface 131ci of the third waveguide member 131c. The second waveguide member 131b is arranged so that the center thereof comes in the y direction between the center of the first waveguide member 131a and the center of the third waveguide member 131c.

Also referring to FIG. 24, the wirings H1, H2, H3, H4, and H5 are lined in the z direction perpendicular to the light receiving surface JS. In accordance with the fourth embodiment of the present invention, the wirings H1, H2, H3, H4, and H5 are shifted so that the wirings H1, H2, H3, H4, and H5 are equally spaced from the side walls of the respective waveguide members 131a, 131b, and 131c.

Conclusion

Since the light receiving surfaces JS of the photodiodes 21 are closer to each other in a pair of pixels in accordance with the fourth embodiment of the present invention, semiconductor elements for capturing images can be shared by the pair. The waveguide path 131 is arranged in alignment with the positional relationship between the micro lens 111 and the light receiving surface JS.

As the solid-state imager 1 of the first embodiment, the solid-state imager 1 of the fourth embodiment improves reliability and production yield, and increases image quality of captured images.

Alternate Embodiments

The present invention is not limited to the above-described embodiments, and a variety of modifications may be implemented.

In the above-described embodiments, the present invention is applied to the CMOS image sensor. The present invention is not limited to the CMOS image sensor. The present invention is equally applicable to a charge-coupled device (CCD) image sensor.

In the above-described embodiments, the apertures are opened in the interlayer insulator and then filled with the optical material in order to produce the waveguide member. The present invention is not limited to this method.

FIGS. 25A and 25B illustrate process steps of a waveguide member in accordance with one embodiment of the present invention.

Referring to FIG. 25A, the first waveguide member 131a is formed. An optical material layer is first formed, and then patterned using the photolithographic technique to form the first waveguide member 131a.

Referring to FIG. 25B, the first interlayer insulator SZa is formed to surround the first waveguide member 131a.

In this way, the waveguide members 131a, 131b, and 131c and the interlayer insulators SZa, SZb, and SZc may be formed.

A side-wall light wave path may be arranged around the side wall of the waveguide path 131.

Figure 26:
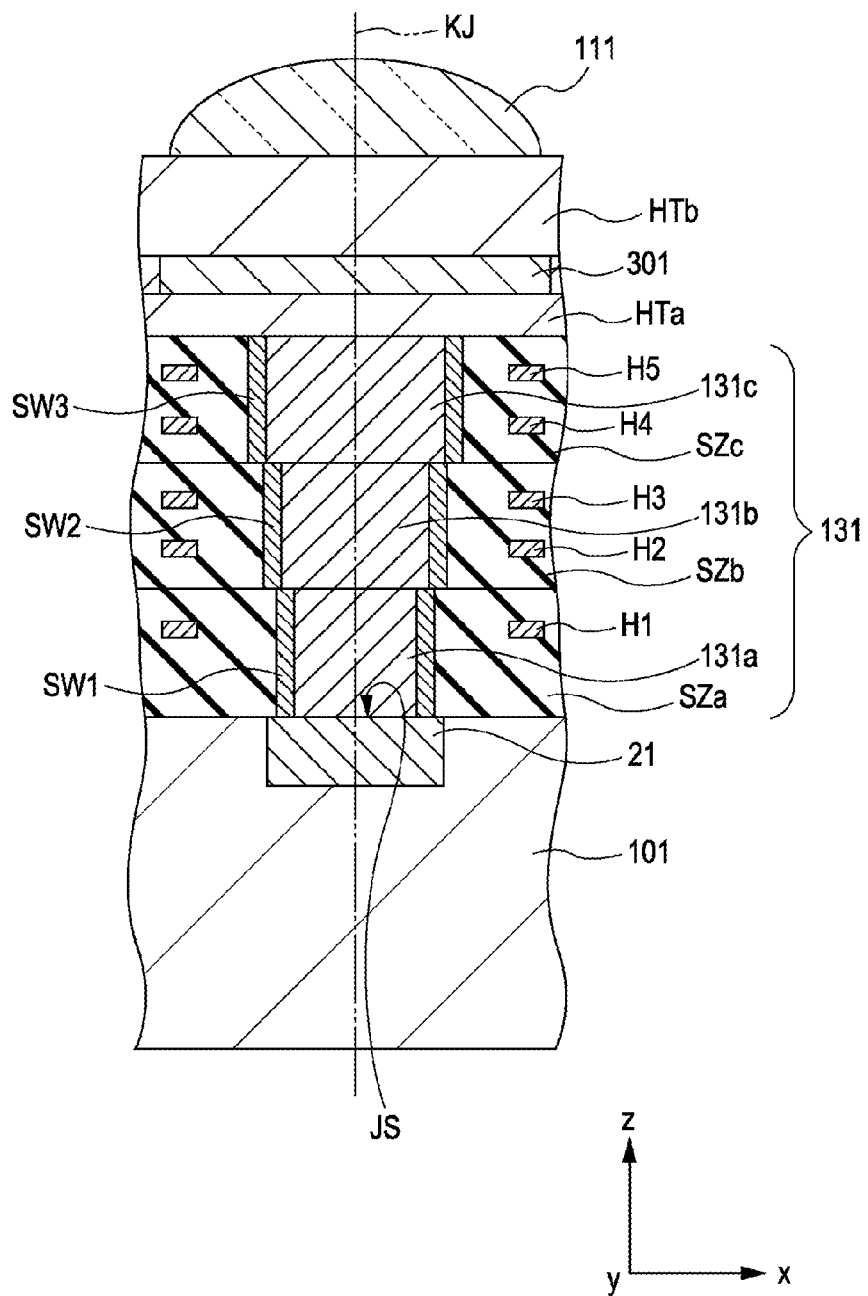
FIG. 26 is a sectional view of a major portion of a solid-state imager in accordance with one embodiment of the present invention.

FIG. 26 is a sectional view illustrating a major portion of a solid-state imager in accordance with one embodiment of the present invention. As FIG. 4, FIG. 26 illustrates a section of the pixel P.

Referring to FIG. 26, a first side-wall waveguide path SW1 is arranged around the side wall of the first waveguide member 131a. A second side-wall waveguide path SW2 is arranged around the side wall of the second waveguide member 131b. A third side-wall waveguide path SW3 is arranged around the side wall of the third waveguide member 131c.

The side-wall waveguide paths SW1-SW3 are manufactured of an optical material having a refraction index higher than that of the interlayer insulators SZa, SZb, and SZc therearound and the waveguide path 131 therewithin. The side-wall waveguide paths SW1-SW3 are manufactured of silicon oxide (SiO), silicon nitride (SiN), silicon carbide (SiC), silicon oxide carbide (SiOC), or the like.

Since light travels while being thus confined to within the side-wall waveguide paths SW1-SW3, high gain results.

In this embodiment, a material having a refraction index lower than that of the first through third interlayer insulators SZa, SZb, and SZc may be arranged to surround the side of the waveguide path 131.

Figure 27:
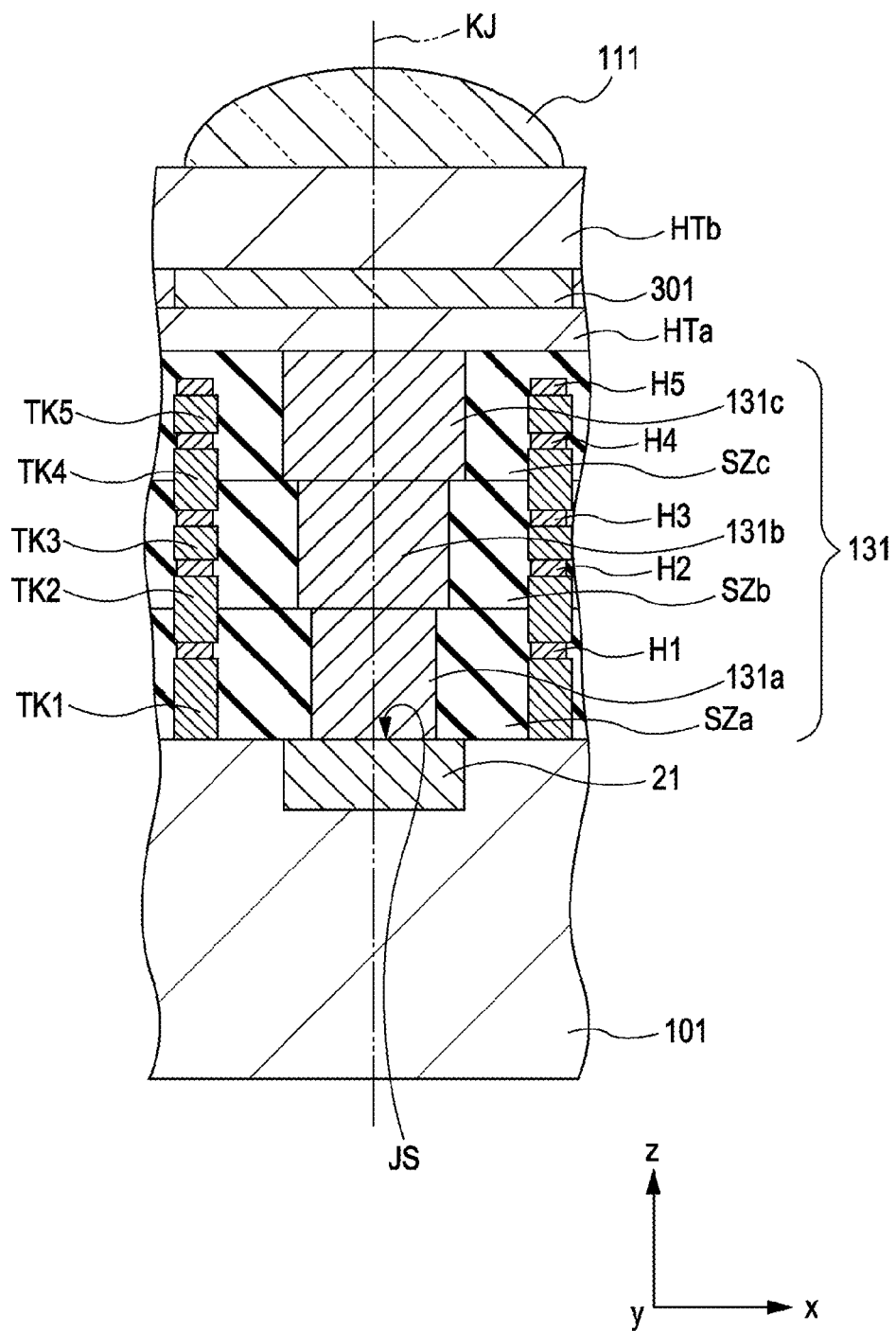
FIG. 27 is a sectional view of a major portion of a solid-state imager in accordance with one embodiment of the present invention.

FIG. 27 is a sectional view of a major portion of a solid-state imager in accordance with such an embodiment. As FIG. 4, FIG. 27 illustrates a section of the pixel P.

Referring to FIG. 27, a first low-refractive-index member TK1 is arranged between the substrate 101 and the first wiring H1. A second low-refractive-index member TK2 is arranged between the first wiring H1 and the second wiring H2. A third low-refractive-index member TK3 is arranged between the second wiring H2 and the third wiring H3. A fourth low-refractive-index member TK4 is arranged between the third wiring H3 and the fourth wiring H4. A fifth low-refractive-index member TK5 is arranged between the fourth wiring H4 and the fifth wiring H5.

Since light output from the side wall of the waveguide path 131 is blocked by the low-refractive-index members TK1, TK2, TK3, TK4, and TK5, the light is prevented from entering the photodiode 21 of an adjacent pixel. Color mixing is controlled, and image quality of captured images is thus increased.

Four pixels P may be combined in one embodiment of the present invention.

Figure 28:
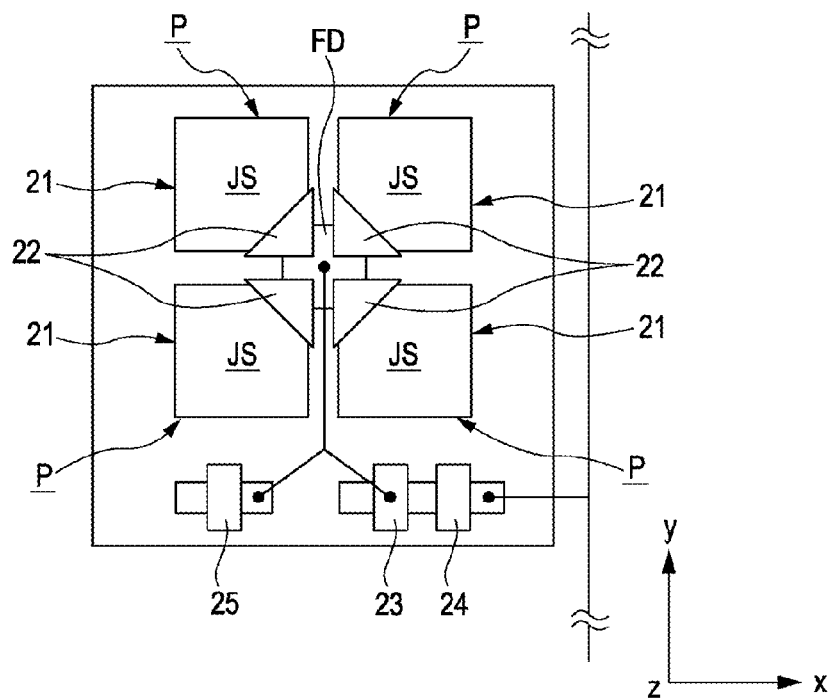
FIG. 28 illustrates a structure of a pixel in accordance with one embodiment of the present invention.

FIG. 28 illustrates a structure of the pixels P in such an embodiment.

Referring to FIG. 28, four pixels P are combined as a set with two light receiving surfaces JS of the photodiodes 21 arranged in the x direction and two light receiving surfaces JS of the photodiodes 21 arranged in the y direction. In the four pixels P, the floating diffusion region FD is arranged at the center of all the four pixels P. A transfer transistor 22 is arranged between the floating diffusion FD and each of the light receiving surfaces JS of the four pixels P. The pixel transistors other than the transfer transistors 22 are shared by the four pixels P.

Specifically, each transfer transistor 22 has the source thereof electrically connected to the respective photodiode 21 and the drain electrically connected to the source of a single reset transistor 25. The floating diffusion region FD is electrically connected to a single amplifier transistor 23. The source of the amplifier transistor 23 is electrically connected to the drain of a single address transistor 24. The drain of each of the reset transistor 25 and the amplifier transistor 23 is supplied with a power voltage from a power source. The address transistor 24 has the source electrically connected to a vertical signal line.

A row transfer signal is supplied to the gate of each transfer transistor 22. The reset transistor 25 receives a row reset signal at the gate thereof. The address transistor 24 receives a row selection signal at the gate thereof. With these signals supplied to the respectively transistors, the read operation of the signal charge is performed on a per pixel basis.

In the above-referenced embodiment, the pixels P are arranged in the x and y directions. The present invention is not limited to this arrangement. The pixels P may be arranged at a slant angle with respect to each of the x and y directions in an embodiment of the present invention.

Figure 29:
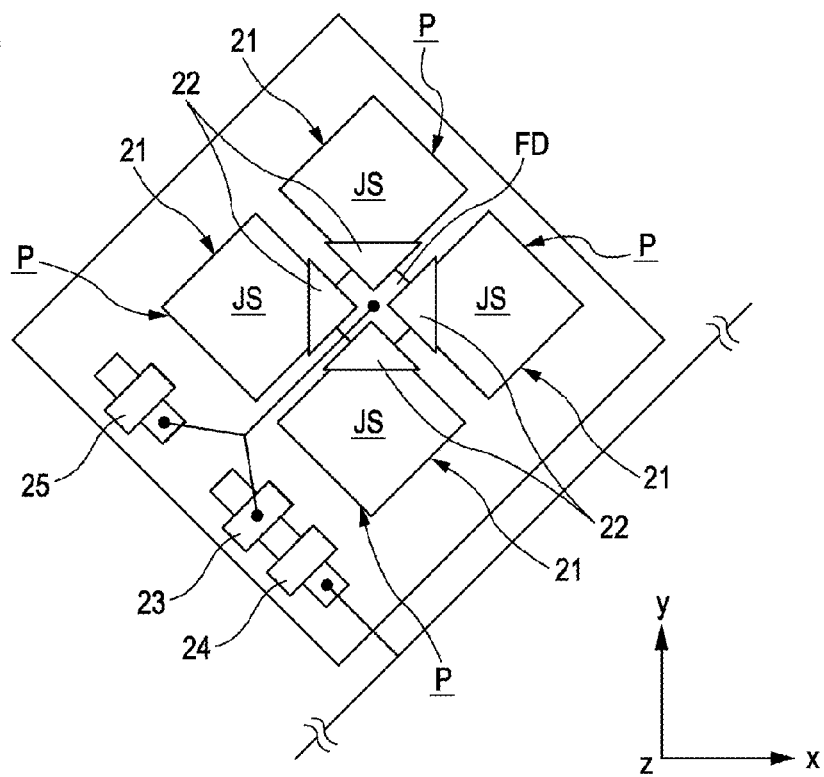
FIG. 29 illustrates a structure of a pixel in accordance with one embodiment of the present invention.

FIG. 29 illustrates a structure of the pixels P in such an embodiment.

Referring to FIG. 29, the pixels P are arranged at 45° with respect to each of the x and y directions.

In each of the above-referenced embodiments, the solid-state imager 1 corresponds to the solid-state imager of embodiments of the present invention. The camera 40 corresponds to the camera of embodiments of the present invention. The photodiode 21 corresponds to the photoelectric conversion region of embodiments of the present invention. The micro lens 111 corresponds to the micro lens of embodiments of the present invention. The waveguide path 131 corresponds to the waveguide path of embodiments of the present invention. The first waveguide member 131a corresponds to the first waveguide member of embodiments of the present invention. The third waveguide member 131c corresponds to the second waveguide member of embodiments of the present invention.

The present application contains subject matter related to that disclosed in Japanese Priority Patent Application JP 2008-293314 filed in the Japan Patent Office on Nov. 17, 2008, and Japanese Priority Patent Application JP 2009-060761 filed in the Japan Patent Office on Mar. 13, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imager, comprising:
   a photoelectric conversion region operable to photoelectrically convert a light beam received on a light receiving surface of the photoelectric conversion region into a signal charge; and
   a waveguide path operable to guide the light beam to the light receiving surface, the waveguide path including a plurality of waveguide members, each waveguide member operable to guide a light beam incident on a light incident surface thereof to a light output surface thereof, the plurality of waveguide members being laminated on the light receiving surface,
   wherein,
      the plurality of waveguide members includes a first waveguide member closest to the light receiving surface from among the plurality of waveguide members, the first waveguide member including a light output surface facing the light receiving surface and a first light incident surface being smaller in area than a second light incident surface of a second waveguide member farthest from the light receiving surface from among the plurality of waveguide members,
      the waveguide path includes a step on a side surface of the waveguide path, and
      the plurality of waveguide members of the waveguide path are laminated so that the width dimension of the step is shorter than the wavelength of the light incident on the waveguide path in a plane extending parallel to the light receiving surface.

2. The solid-state imager according to claim 1, wherein each of the plurality of waveguide members of the waveguide path extends in a direction perpendicular to the light receiving surface.

3. The solid-state imager according to claim 2, wherein:
   the step extends in the direction perpendicular to the light receiving surface,
   each of the plurality of waveguide members have a side surface positioned along the plane extending parallel to the light receiving surface, and
   the plurality of waveguide members are laminated so that light emitted at the step of the waveguide path re-enters the waveguide path as evanescent light.

4. The solid-state imager according to claim 2, wherein the step of the waveguide path is tapered with respect to the direction perpendicular to the light receiving surface.

5. The solid-state imager according to one of claims 1 through 3 and 4, wherein the first waveguide member of the waveguide path has the light output surface smaller in area than the light receiving surface of the photoelectric conversion region.

6. The solid-state imager according to claim 5, wherein:
   a plurality of photoelectric conversion regions are arranged on a surface of a substrate, and
   a plurality of waveguide paths are arranged on the surface of the substrate respectively for the plurality of photoelectric regions.

7. The solid-state imager according to claim 6, wherein:
   the plurality of photoelectric conversion regions are arranged with the light receiving surfaces thereof spaced from each other with a first pitch on the surface of the substrate, and
   the plurality of waveguide paths are arranged with the light incident surfaces of the second waveguide members thereof spaced from each other with a second pitch on the surface of the substrate, the second pitch being smaller than the first pitch, and the light output surface of the first waveguide member is shifted with respect to the light incident surface of the second waveguide member in a plane in parallel with the light receiving surface so that the light output surface of the first waveguide member faces the light receiving surface.

8. The solid-state imager according to claim 7, further comprising a plurality of wirings lined in a direction perpendicular to the light receiving surface and spaced from the side surface of the waveguide path, wherein the plurality of wirings include a first wiring arranged to the side surface of the first waveguide member and a second wiring arranged to the side surface of the second waveguide member, and the first wiring and the second wiring are arranged in different positions in a plane in parallel with the light receiving surface.

9. The solid-state imager according to claim 7, further comprising a plurality of micro lenses for directing incident light toward the waveguide path, wherein the plurality of micro lenses are arranged respectively for the plurality of the waveguide paths on the surface of the substrate.

10. The solid-state imager according to claim 6, further comprising a plurality of micro lenses for directing incident light toward the waveguide path,
wherein,
the plurality of micro lenses are arranged respectively for the plurality of the waveguide paths on the surface of the substrate, and the optical axis of each micro lens is shifted from the center of the respective light receiving surface, and
the first waveguide member and the second waveguide member are shifted in a plane in parallel with the light receiving surface so that the light incident surface of the first waveguide member is aligned with the light output surface of the micro lens and so that the light output surface of the second waveguide member is aligned with the light receiving surface.

11. A camera, comprising:
a photoelectric conversion region operable to photoelectrically convert a light beam received on a light receiving surface of the photoelectric conversion region into a signal charge; and
a waveguide path operable to guide the light beam to the light receiving surface, the waveguide path including a plurality of waveguide members, each waveguide member operable to guide a light beam incident on a light incident surface thereof to a light output surface thereof, the plurality of waveguide members being laminated on the light receiving surface,
wherein,
the plurality of waveguide members includes a first waveguide member closest to the light receiving surface from among the plurality of waveguide members, the first waveguide member including a light output surface facing the light receiving surface and a first light incident surface being smaller in area than a second light incident surface of a second waveguide member farthest from the light receiving surface from among the plurality of waveguide members,
the waveguide path includes a step on a side surface of the waveguide path, and
the plurality of waveguide members of the waveguide path are laminated so that the width dimension of the step is shorter than the wavelength of the light incident on the waveguide path in a plane extending parallel to the light receiving surface.

12. The camera according to claim 11, wherein each of the plurality of waveguide members have a side surface defining a portion of the waveguide path, each of the side surfaces of the plurality of waveguide members extending perpendicular to the light receiving surface.

13. A method of manufacturing a solid-state imager, comprising the steps of:
forming a photoelectric conversion region operable to photoelectrically convert a light beam received on a light receiving surface of the photoelectric conversion region into a signal charge; and
forming a waveguide path operable to guide the light beam to the light receiving surface,
wherein,
the step of forming the waveguide path includes laminating a plurality of waveguide members on the light receiving surface, each waveguide member operable to guide a light beam on a light incident surface thereof to a light output surface thereof, and
the plurality of waveguide members includes a first waveguide member closest to the light receiving surface from among the plurality of waveguide members, the first waveguide member including a light output surface facing the light receiving surface and a first light incident surface being smaller in area than a second light incident surface of a second waveguide member farthest from the light receiving surface from among the plurality of waveguide members,
the waveguide path includes a step on a side surface of the waveguide path, and
the plurality of waveguide members of the waveguide path are laminated so that the width dimension of the step is shorter than the wavelength of the light incident on the waveguide path in a plane extending parallel to the light receiving surface.

14. The method according to claim 13, wherein each of the plurality of waveguide members have a side surface defining a portion of the waveguide path, each of the side surfaces of the plurality of waveguide members extending perpendicular to the light receiving surface.

* * * * *